(12) United States Patent
Lee

(10) Patent No.: US 10,083,944 B2
(45) Date of Patent: Sep. 25, 2018

(54) DISPLAY DEVICE USING SEMICONDUCTOR LIGHT EMITTING DEVICE AND FABRICATION METHOD THEREOF

(71) Applicant: LG ELECTRONICS INC., Seoul (KR)

(72) Inventor: Minwoo Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/645,386

(22) Filed: Jul. 10, 2017

(65) Prior Publication Data

US 2018/0151543 A1 May 31, 2018

(30) Foreign Application Priority Data

Nov. 25, 2016 (KR) .................. 10-2016-0158573

(51) Int. Cl.
*H01L 33/60* (2010.01)
*H01L 33/58* (2010.01)
*H01L 33/54* (2010.01)
*H01L 33/50* (2010.01)
*H01L 33/00* (2010.01)
(Continued)

(52) U.S. Cl.
CPC ...... *H01L 25/0753* (2013.01); *H01L 23/5386* (2013.01); *H01L 33/007* (2013.01); *H01L 33/0079* (2013.01); *H01L 33/32* (2013.01); *H01L 33/505* (2013.01); *H01L 33/54* (2013.01); *H01L 33/58* (2013.01); *H01L 33/60* (2013.01); *H01L 33/62* (2013.01); *H01L 23/5387* (2013.01); *H01L 2933/005* (2013.01); *H01L 2933/0016* (2013.01);
(Continued)

(58) Field of Classification Search
CPC ... H01L 33/007; H01L 33/0079; H01L 33/60; H01L 2933/0041; H01L 25/0753
See application file for complete search history.

(56) References Cited

U.S. PATENT DOCUMENTS

| 2005/0194599 | A1 | 9/2005 | Tanaka | |
| 2011/0096560 | A1* | 4/2011 | Ryu | .......... C09K 11/0883 362/510 |

(Continued)

FOREIGN PATENT DOCUMENTS

| KR | 10-2011-0130851 A | 12/2011 |
| KR | 10-1350159 B1 | 2/2014 |
| KR | 10-2016-0116550 A | 10/2016 |

*Primary Examiner* — Mohsen Ahmadi
(74) *Attorney, Agent, or Firm* — Birch, Stewart, Kolasch & Birch, LLP

(57) ABSTRACT

A display device including a growth substrate; a plurality of semiconductor light emitting devices grown on the growth substrate and disposed on one surface of the growth substrate; a plurality of through holes passing through the growth substrate at positions overlapping with the semiconductor light emitting devices; a wavelength conversion material filled into the through holes to convert a wavelength of light emitted from corresponding semiconductor light emitting devices; and a wiring substrate electrically connected to an electrode of the semiconductor light emitting devices disposed at an opposite side of the growth substrate by interposing the semiconductor light emitting devices therebetween.

9 Claims, 18 Drawing Sheets

(51) Int. Cl.
*H01L 25/075* (2006.01)
*H01L 33/62* (2010.01)
*H01L 33/32* (2010.01)
*H01L 23/538* (2006.01)

(52) U.S. Cl.
CPC ............ *H01L 2933/0041* (2013.01); *H01L 2933/0058* (2013.01); *H01L 2933/0066* (2013.01)

(56) References Cited

U.S. PATENT DOCUMENTS

| | | | | |
|---|---|---|---|---|
| 2012/0074441 A1* | 3/2012 | Seo | ............... | H01L 27/153 257/91 |
| 2012/0223326 A1 | 9/2012 | Kwak et al. | | |
| 2014/0231858 A1* | 8/2014 | Lee | ............... | H01L 33/486 257/99 |
| 2014/0239341 A1* | 8/2014 | Matsumura | ............ | H01L 33/36 257/99 |
| 2015/0255439 A1* | 9/2015 | Kim | ............... | H01L 25/0753 257/89 |
| 2015/0255505 A1* | 9/2015 | Jeoung | ............... | G06F 1/1652 257/89 |
| 2015/0349201 A1* | 12/2015 | Lee | ............... | H01L 33/22 257/79 |
| 2016/0118547 A1* | 4/2016 | Kawai | ............... | H01L 25/0753 257/88 |
| 2016/0141446 A1* | 5/2016 | Huang | ............... | H01L 33/0079 438/27 |
| 2016/0218142 A1* | 7/2016 | Bang | ............... | H01L 21/768 |
| 2016/0284927 A1* | 9/2016 | Cho | ............... | H01L 33/005 |
| 2016/0284941 A1* | 9/2016 | Seo | ............... | H01L 33/46 |
| 2016/0365486 A1* | 12/2016 | Kim | ............... | H01L 33/382 |
| 2017/0012026 A1* | 1/2017 | Choi | ............... | H01L 25/0753 |
| 2017/0069069 A1* | 3/2017 | Winzell | ............... | G06T 5/40 |
| 2017/0117257 A1* | 4/2017 | Lee | ............... | H01L 25/0753 |
| 2017/0170152 A1* | 6/2017 | Wi | ............... | H01L 24/29 |
| 2017/0200765 A1* | 7/2017 | Choi | ............... | H01L 33/504 |
| 2017/0207249 A1* | 7/2017 | Rhee | ............... | G09G 3/3233 |
| 2017/0229624 A1* | 8/2017 | Beppu | ............... | H01L 33/60 |
| 2017/0229626 A1* | 8/2017 | Yang | ............... | H01L 33/62 |
| 2017/0288088 A1* | 10/2017 | Won Cheol | ......... | H01L 33/0025 |
| 2017/0345692 A1* | 11/2017 | Liu | ............... | H01L 21/67144 |
| 2017/0345802 A1* | 11/2017 | Sung | ............... | H01L 25/0753 |

\* cited by examiner

DISPLAY DEVICE USING SEMICONDUCTOR LIGHT EMITTING DEVICE AND FABRICATION METHOD THEREOF

CROSS-REFERENCE TO RELATED APPLICATIONS

This application claims the benefit of priority of Korean Patent Application No. 10-2016-0158573, filed on Nov. 25, 2016, which is expressly incorporated by reference in its entirety.

BACKGROUND OF THE INVENTION

1. Field of the Invention

The present disclosure relates to a display device and a fabrication method thereof, and more particularly, to a display device using a semiconductor light emitting device.

2. Description of the Related Art

In recent years, display devices having excellent characteristics such as a low profile, flexibility and the like have been developed. Currently commercialized main displays are represented by liquid crystal displays (LCDs) and active matrix organic light emitting diodes (AMOLEDs). However, there exist problems such as a slow response time, difficult implementation of flexibility for LCDs, and there exist drawbacks such as short life span, poor yield as well as low flexibility for AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, semiconductor light emitting devices can be used to implement a flexible display, thereby presenting a scheme for solving the problems described above.

In a display using the semiconductor light emitting device, a semiconductor light emitting device grown on a growth substrate can be transferred to a wiring substrate, and then the growth substrate removed. However, such a method has a disadvantage in that it is difficult to secure fabrication reliability, and its fabrication cost is high. In particular, there is a problem that it is difficult to apply this method to a display of digital signage because of such disadvantage.

SUMMARY OF THE INVENTION

Accordingly, one object of the present disclosure is to address the above-noted and other problems of the related art.

Another object of the present disclosure is to provide a display device and a manufacturing method thereof with a novel structure in which a process of removing a growth substrate is not required.

Still another object of the present disclosure is to provide a fabrication method of a display device capable of reducing a fabrication cost.

Another object is to provide a display device with a novel structure using a growth substrate as a partition wall of the display in which a process of removing the growth substrate is not required.

To achieve these and other advantages and in accordance with the purpose of the present invention, as embodied and broadly described herein, the present invention provides in one aspect a display device including a growth substrate; a plurality of semiconductor light emitting devices grown on the growth substrate and disposed on one surface of the growth substrate; a plurality of through holes passing through the growth substrate at positions overlapping with the semiconductor light emitting devices; a wavelength conversion material filled into the through holes to convert a wavelength of light emitted from corresponding semiconductor light emitting devices; and a wiring substrate electrically connected to an electrode of the semiconductor light emitting devices disposed at an opposite side of the growth substrate by interposing the semiconductor light emitting devices therebetween.

In another aspect, the present invention provides fabrication method of a display device, which includes sequentially growing an n-type semiconductor layer, an active layer and a p-type semiconductor layer on a growth substrate; etching the p-type semiconductor layer, the active layer and the n-type semiconductor layer to form a plurality of semiconductor light emitting devices on the substrate; forming electrodes on the plurality of semiconductor light emitting devices; forming a protective layer that fills between the semiconductor light emitting devices on one surface of the growth substrate; etching the growth substrate to form through holes passing through the growth substrate at positions overlapping with the semiconductor light emitting devices; and filling a wavelength conversion material that converts a wavelength of light emitted from the semiconductor light emitting devices into the through holes.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
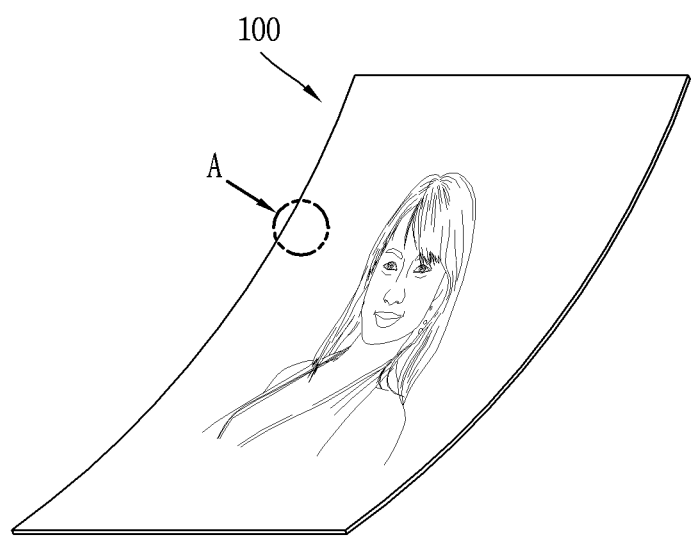
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the other element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure. According to the illustration, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information can be implemented by individually controlling the light emission of sub-pixels disposed in a matrix form. The sub-pixel denotes a minimum unit for implementing one color.

The sub-pixel of the flexible display can be implemented by a semiconductor light emitting device. According to an embodiment of the present disclosure, a light emitting diode (LED) is illustrated as a type of semiconductor light emitting device. The light emitting diode can be formed with a small size to perform the role of a sub-pixel even in the second configuration.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
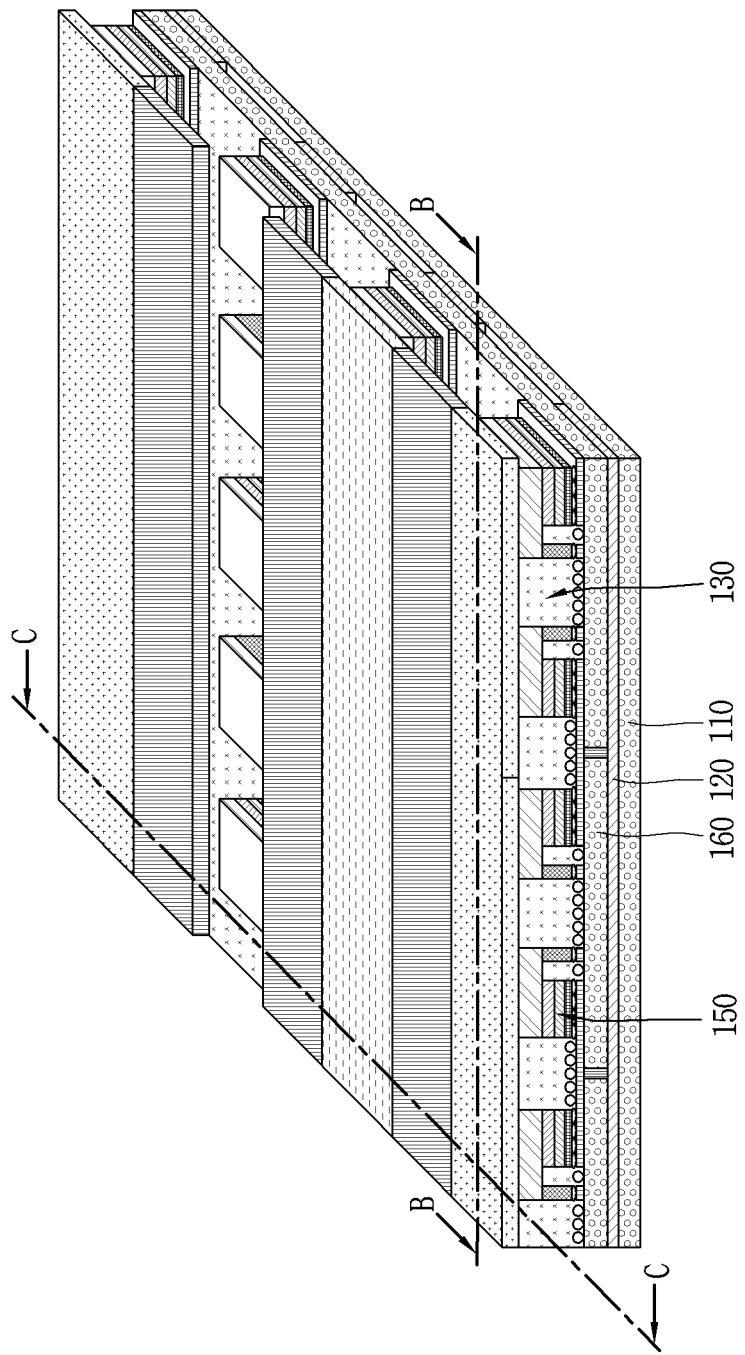
FIG. 2 is a partial enlarged view of portion "A" in FIG. 1.
Figure 3A:
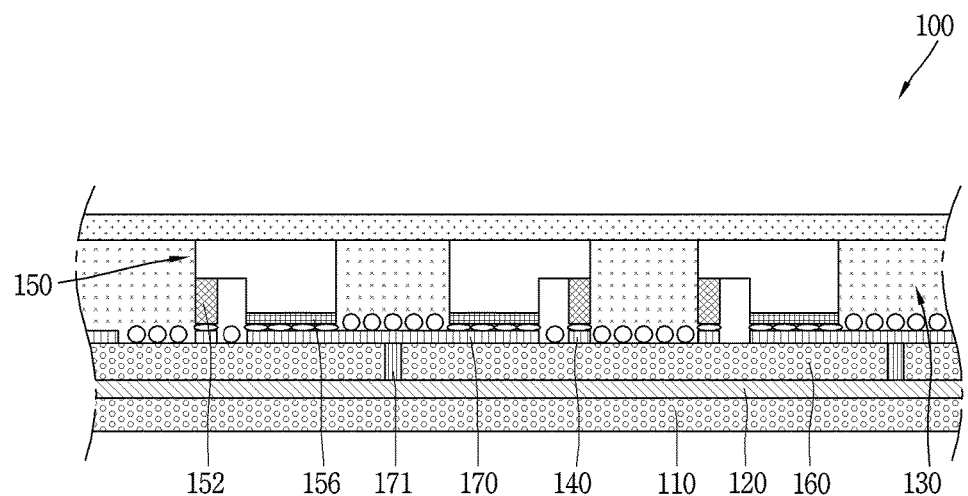
FIGS. 3A and 3B are cross-sectional views taken along lines B-B and C-C in FIG. 2.
Figure 3B:
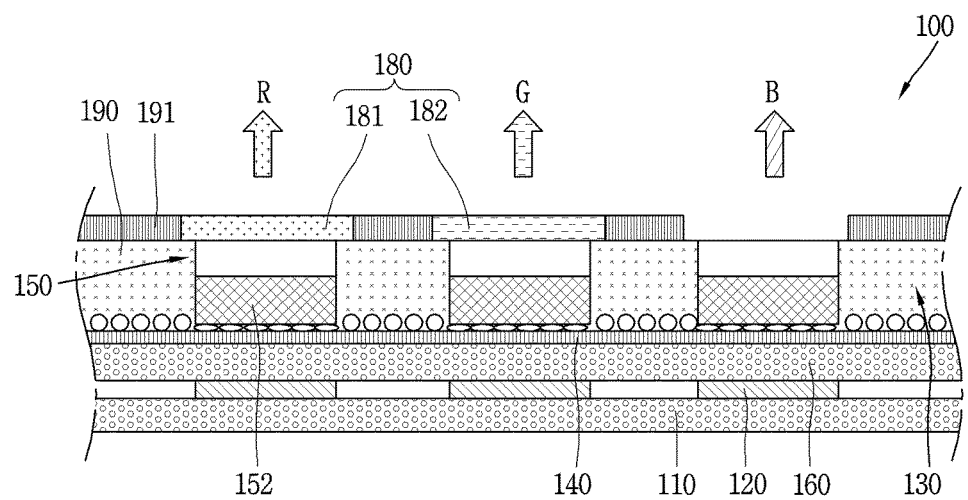
Figure 4:
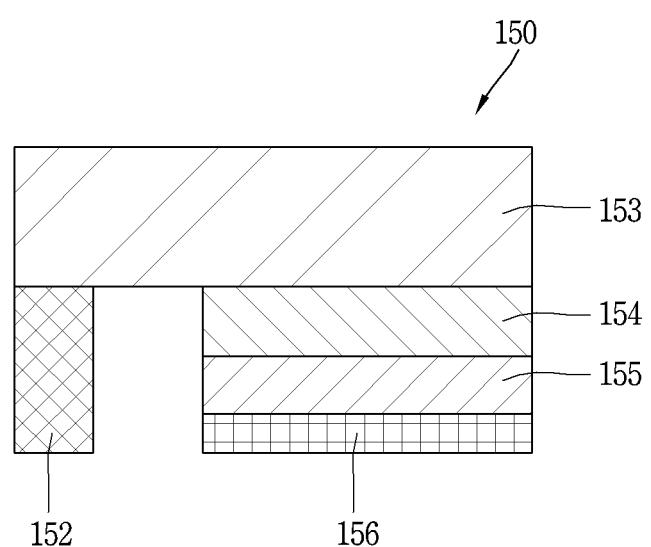
FIG. 4 is a conceptual view illustrating a flip-chip type semiconductor light emitting device in FIG. 3.

FIGS. 2, 3A and 3B illustrate a display device 100 using a passive matrix (PM) type semiconductor light emitting device. However, the following illustration can be also applicable to an active matrix (AM) type semiconductor light emitting device.

The display device 100 includes a substrate 110, a first electrode 120, a conductive adhesive layer 130, a second electrode 140, and a plurality of semiconductor light emitting devices 150. The substrate 110 can be a flexible substrate and contains glass or polyimide (PI) to implement the flexible display device. In addition, if it is a flexible material, any one such as polyethylene naphthalate (PEN), polyethylene terephthalate (PET) or the like can be used. Furthermore, the substrate 110 can be either one of transparent and non-transparent materials. The substrate 110 can also be a wiring substrate disposed with the first electrode 120, and thus the first electrode 120 can be placed on the substrate 110.

According to the illustration, an insulating layer 160 is disposed on the substrate 110 placed with the first electrode 120, and an auxiliary electrode 170 is placed on the insulating layer 160. In this instance, a configuration in which the insulating layer 160 is deposited on the substrate 110 can be a single wiring substrate. More specifically, the insulating layer 160 can be incorporated into the substrate 110 with an insulating and flexible material such as polyimide (PI), PET, PEN or the like to form a single wiring substrate.

Further, the auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and can be electrically connected to the first electrode 120 by an electrode hole 171 passing through the insulating layer 160. The electrode hole 171 can be formed by filling a conductive material in a via hole.

Referring to the drawings, the conductive adhesive layer 130 can be formed on one surface of the insulating layer 160, but the present disclosure is not limited to this. For example, it is possible to also have a structure in which the conductive adhesive layer 130 is disposed on the substrate 110 with no insulating layer 160. Further, the conductive adhesive layer 130 can perform the role of an insulating layer in the structure in which the conductive adhesive layer 130 is disposed on the substrate 110.

In addition, the conductive adhesive layer 130 can be a layer having adhesiveness and conductivity, and thus, a conductive material and an adhesive material can be mixed on the conductive adhesive layer 130. Furthermore, the conductive adhesive layer 130 can have flexibility, thereby allowing a flexible function in the display device.

For example, the conductive adhesive layer 130 can be an anisotropic conductive film (ACF), an anisotropic conductive paste, a solution containing conductive particles, and the like. The conductive adhesive layer 130 allows electrical interconnection in the z-direction passing through the thickness thereof, but can be configured as a layer having electrical insulation in the horizontal x-y direction thereof. Accordingly, the conductive adhesive layer 130 can be referred to as a z-axis conductive layer (hereinafter referred to as a "conductive adhesive layer").

The anisotropic conductive film includes an anisotropic conductive medium mixed with an insulating base member, and thus when heat and pressure are applied thereto, only a specific portion thereof has conductivity by the anisotropic conductive medium. Hereinafter, heat and pressure are applied to the anisotropic conductive film, but other methods can be also available for the anisotropic conductive film to partially have conductivity. The methods include applying one of heat and pressure thereto, UV curing, and the like.

Furthermore, the anisotropic conductive medium can be conductive balls or particles. According to the illustration, in the present embodiment, the anisotropic conductive film includes an anisotropic conductive medium mixed with an insulating base member, and thus when heat and pressure are applied thereto, only a specific portion thereof has conductivity by the conductive balls. The anisotropic conductive film may be a core with a conductive material containing a plurality of particles coated by an insulating layer with a polymer material, and can have conductivity by the core while breaking an insulating layer on a portion to which heat and pressure are applied. Here, a core can be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

In another example, an anisotropic conductive film can include a plurality of particles in which a conductive material is coated on insulating cores. In this instance, a portion to which heat and pressure are applied can be converted (pressed and adhered) to a conductive material to have conductivity in the thickness direction of the film. In still another example, the anisotropic can be formed to have conductivity in the thickness direction of the film in which a conductive material passes through an insulating base member in the z-direction. The conductive material may have a pointed end portion.

According to the illustration, the anisotropic conductive film may be a fixed array anisotropic conductive film (ACF) including conductive balls inserted into one surface of the insulating base member. More specifically, the insulating base member includes an adhesive material, and the conductive balls are intensively disposed at a bottom portion of the insulating base member. When heat and pressure are applied thereto, the base member is modified along with the conductive balls, thereby having conductivity in the vertical direction thereof.

However, the present disclosure is not limited to this, and the anisotropic conductive film can include conductive balls randomly mixed with an insulating base member or include a plurality of layers in which conductive balls are disposed at any one layer (double-ACF), and the like. The anisotropic conductive paste includes conductive balls mixed with an insulating and adhesive base material. Furthermore, a solution containing conductive particles may include conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device 150 can be a flip chip type semiconductor light emitting device. For example, the semiconductor light emitting device can include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 can be electrically connected to a welding portion by the conductive adhesive layer 130, and the n-type electrode 152 can be electrically connected to the second electrode 140.

Referring again to FIGS. 2, 3A and 3B, the auxiliary electrode 170 can be formed in an elongated manner in one direction to be electrically connected to a plurality of semiconductor light emitting devices 150. For example, the left and right p-type electrodes of the semiconductor light emitting devices around the auxiliary electrode can be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity because there is no push-down of the semiconductor light emitting device. As described above, the conductive adhesive layer 130 can form an electrical connection as well as allow a mutual coupling between the semiconductor light emitting device 150 and the auxiliary electrode 170 and between the semiconductor light emitting device 150 and the second electrode 140. Furthermore, a plurality of semiconductor light emitting devices 150 constitute a light-emitting array, and a phosphor layer 180 is formed on the light-emitting array.

The light emitting device array can include a plurality of semiconductor light emitting devices with different self luminance values. Each of the semiconductor light emitting devices 150 constitutes a sub-pixel, and is electrically connected to the first electrode 120. For example, a plurality of first electrodes 120 are included, and the semiconductor light emitting devices are arranged in several rows, for instance. Each row of the semiconductor light emitting devices can be electrically connected to any one of the plurality of first electrodes.

Furthermore, the semiconductor light emitting devices can be connected in a flip chip form, and thus semiconductor light emitting devices grown on a transparent dielectric substrate. The semiconductor light emitting devices can also be nitride semiconductor light emitting devices, for instance. In addition, the semiconductor light emitting device 150 has an excellent luminance characteristic, and can correspond to individual sub-pixels even with a small size thereof.

According to FIG. 3B, a partition wall 190 can be formed between the semiconductor light emitting devices 150 and divide individual sub-pixels from one another, and be formed as an integral body with the conductive adhesive layer 130. For example, a base member of the anisotropic conductive film can form the partition wall when the semiconductor light emitting device 150 is inserted into the anisotropic conductive film.

When the base member of the anisotropic conductive film is black, the partition wall 190 can have reflective characteristics while at the same time increasing contrast with no additional black insulator. In another example, a reflective partition wall can be separately provided with the partition wall 190. In this instance, the partition wall 190 can include a black or white insulator according to the purpose of the display device. Thus, the partition wall 190 enhances reflectivity, and increases contrast while at the same time having reflective characteristics.

In addition, the phosphor layer 180 can be located at an outer surface of the semiconductor light emitting device 150. For example, the semiconductor light emitting device 150 is a blue semiconductor light emitting device that emits blue (B) light, and the phosphor layer 180 converts the blue (B) light into the color of a sub-pixel. The phosphor layer 180 can be a red phosphor layer 181 or green phosphor layer 182 constituting individual pixels.

In other words, a red phosphor 181 capable of converting blue light into red (R) light can be deposited on the blue semiconductor light emitting device 151 at a location implementing a red sub-pixel, and a green phosphor 182 capable of converting blue light into green (G) light can be deposited on the blue semiconductor light emitting device 151 at a location implementing a green sub-pixel. Furthermore, only the blue semiconductor light emitting device 151 can be solely used at a location implementing a blue sub-pixel. In this instance, the red (R), green (G) and blue (B) sub-pixels can implement one pixel. More specifically, one color phosphor can be deposited along each line of the first electrode 120. Accordingly, one line on the first electrode 120 can be an electrode controlling one color. In other words, red (R), green (B) and blue (B) can be sequentially disposed, thereby implementing sub-pixels.

However, the present disclosure is not limited to this, and the semiconductor light emitting device 150 can be combined with a quantum dot (QD) instead of a phosphor to implement sub-pixels such as red (R), green (G) and blue (B). The black matrix 191 can also be disposed between each phosphor layer to enhance contrast of luminance. However, the present disclosure is not limited to this, and another structure for implementing blue, red and green can be also applicable thereto.

Figure 5A:
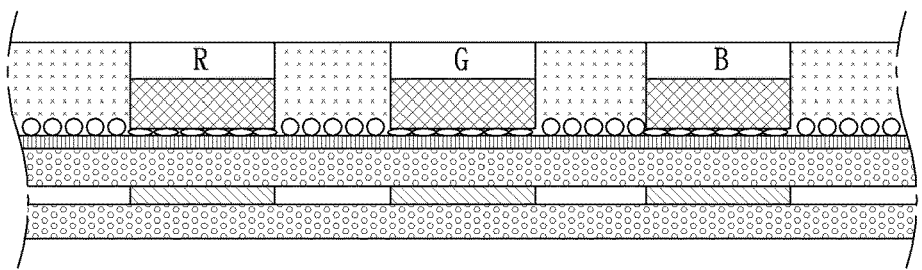
FIGS. 5A through 5C are conceptual views illustrating various forms for implementing colors in connection with a flip-chip type semiconductor light emitting device.

Referring to FIG. 5A, each of the semiconductor light emitting devices 150 can be implemented with a high-power light emitting device that emits various lights including blue in which gallium nitride (GaN) is mostly used, and indium (In) and or aluminum (Al) are added thereto. Further, the semiconductor light emitting device 150 can be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
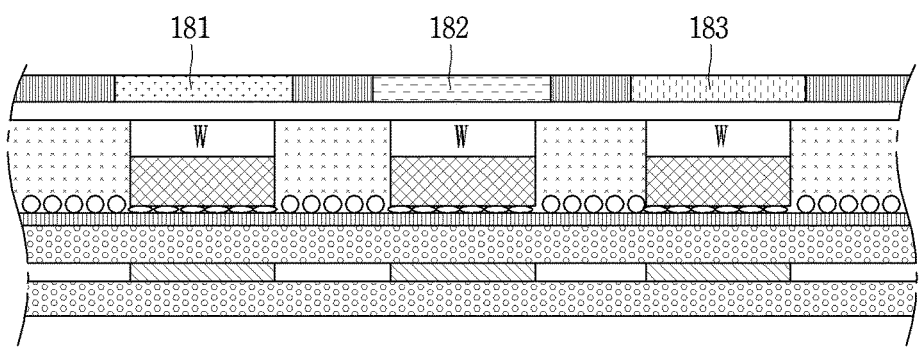

Referring to FIG. 5B, the semiconductor light emitting device can have a white light emitting device (W) provided with a yellow phosphor layer for each element. As shown, a red phosphor layer 181, a green phosphor layer 182 and blue phosphor layer 183 are provided on the white light emitting device (W) to implement a sub-pixel. Furthermore, a color filter repeated with red, green and blue on the white light emitting device (W) can be used to implement a sub-pixel.

Figure 5C:
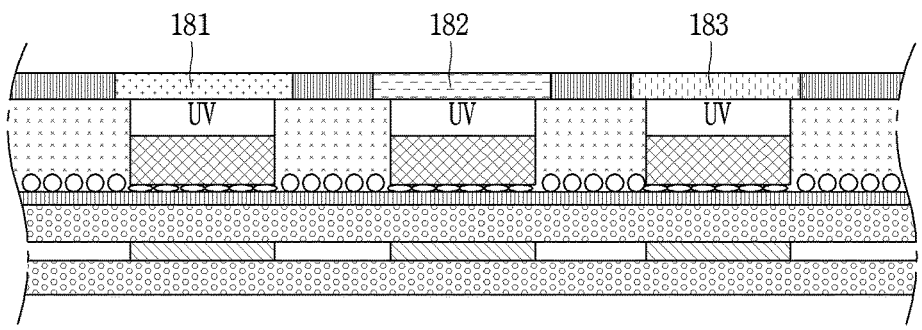

Referring to FIG. 5C, it is possible to also have a structure in which a red phosphor layer 181, a green phosphor layer 182 and blue phosphor layer 183 are provided on a ultra violet light emitting device (UV). Thus, the semiconductor light emitting device can be used over the entire region up to ultra violet (UV) as well as visible light, and can be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. Further, the semiconductor light emitting device 150 has excellent luminance characteristics, and thus it is possible to configure individual sub-pixels even with a small size thereof. The size of the individual semiconductor light emitting device 150 can also be less than 80 µm in the length of one side thereof, and formed with a rectangular or square shaped element. For a rectangular shaped element, the size thereof can be less than 20×80 µm.

Furthermore, even when a square shaped semiconductor light emitting device 150 with a length of side of 10 µm is used for a sub-pixel, the sub-pixel exhibits a sufficient brightness for implementing a display device. Accordingly, for example, for a rectangular pixel in which one side of a sub-pixel is 600 µm in size, and the remaining one side thereof is 300 µm, a relative distance between the semiconductor light emitting devices becomes sufficiently large. Accordingly, in this instance, it is possible to implement a flexible display device having a HD image quality.

Figure 6:
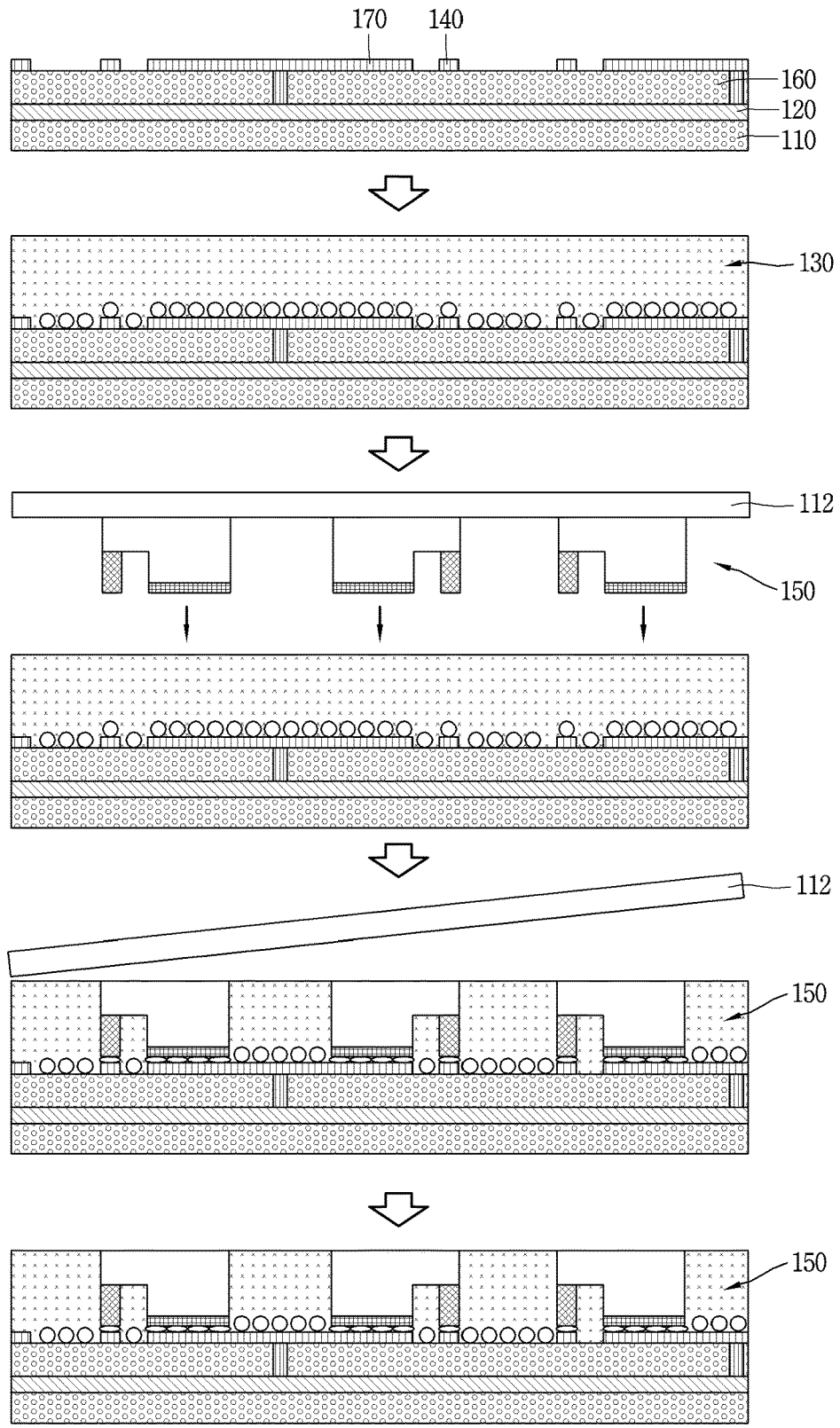
FIG. 6 is cross-sectional views illustrating a fabrication method of a display device using a semiconductor light emitting device according to an embodiment of the present disclosure.

A display device using the foregoing semiconductor light emitting device is fabricated by a novel type of fabrication method. Hereinafter, the fabrication method will be described with reference to FIG. 6. In particular, FIG. 6 includes cross-sectional views illustrating a method of fabricating a display device using a semiconductor light emitting device according to an embodiment of the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 can be disposed in a perpendicular direction to each other. Furthermore, the first substrate 110 and insulating layer 160 can contain glass or polyimide (PI), respectively, to implement a flexible display device.

As discussed above, the conductive adhesive layer 130 can be implemented by an anisotropic conductive film, for example, and the anisotropic conductive film can be coated on a substrate located with the insulating layer 160. Next, a second substrate 112 located with a plurality of semiconductor light emitting devices 150 corresponding to the location of the auxiliary electrodes 170 and second electrodes 140 and constituting individual pixels is disposed such that the semiconductor light emitting devices 150 face the auxiliary electrode 170 and second electrode 140.

Further, the second substrate 112 as a growth substrate for growing the semiconductor light emitting device 150 can be a sapphire substrate or silicon substrate. In addition, the semiconductor light emitting device can have a gap and size capable of implementing a display device when formed in the unit of wafer, and thus effectively used for a display device.

Next, the wiring substrate is thermally compressed to the second substrate 112. For example, the wiring substrate and second substrate 112 can be thermally compressed to each other by applying an ACF press head. In addition, the wiring substrate and second substrate 112 are bonded to each other using the thermal compression. As discussed above, a portion between the semiconductor light emitting device 150 and the auxiliary electrode 170 and second electrode 140 have conductivity due to the characteristics of an anisotropic conductive film having conductivity by thermal compression, thereby allowing the electrodes and semiconductor light emitting device 150 to be electrically connected to each other. The semiconductor light emitting device 150 is also inserted into the anisotropic conductive film, thereby forming a partition wall between the semiconductor light emitting devices 150.

Next, the second substrate 112 is removed using a laser lift-off (LLO) or chemical lift-off (CLO) method, for example. Finally, the second substrate 112 is removed to expose the semiconductor light emitting devices 150 to the outside. Silicon oxide (SiOx) or the like can be coated on the wiring substrate coupled to the semiconductor light emitting device 150 to form a transparent insulating layer.

A phosphor layer can also be formed on one surface of the semiconductor light emitting device 150. For example, the semiconductor light emitting device 150 can be a blue semiconductor light emitting device for emitting blue (B) light, and red or green phosphor for converting the blue (B) light into the color of the sub-pixel can form a layer on one surface of the blue semiconductor light emitting device.

The fabrication method or structure of a display device using the foregoing semiconductor light emitting device can be modified in various forms. For example, the foregoing display device can be applicable to a vertical semiconductor light emitting device. Hereinafter, the vertical structure will be described with reference to FIGS. 5 and 6.

Figure 7:
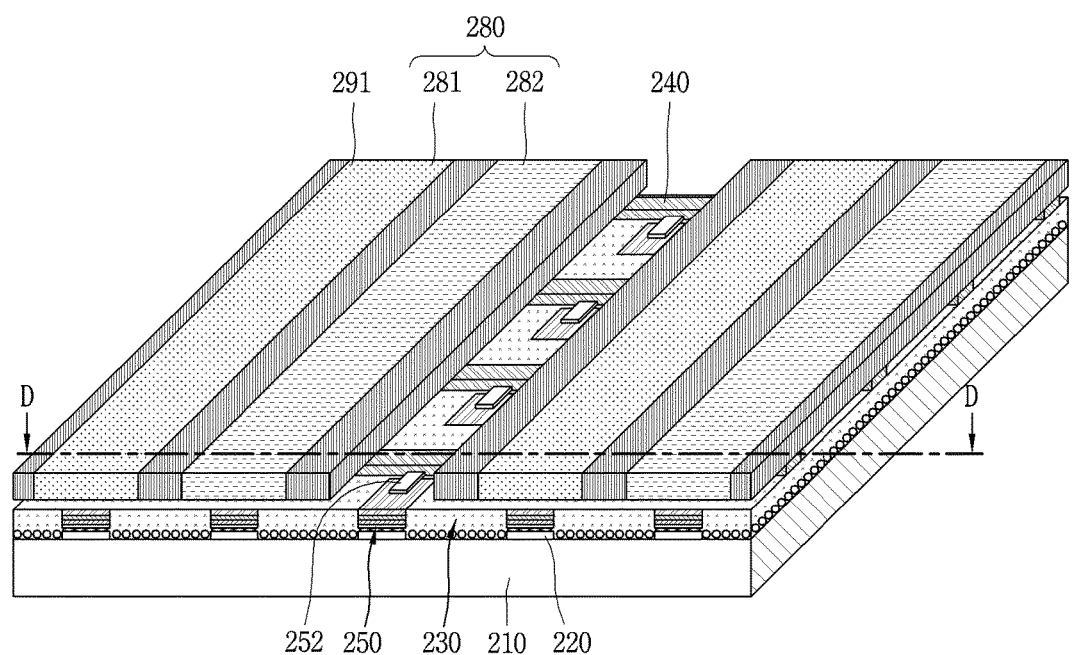
FIG. 7 is a perspective view illustrating a display device using a semiconductor light emitting device according to another embodiment of the present disclosure.
Figure 8:
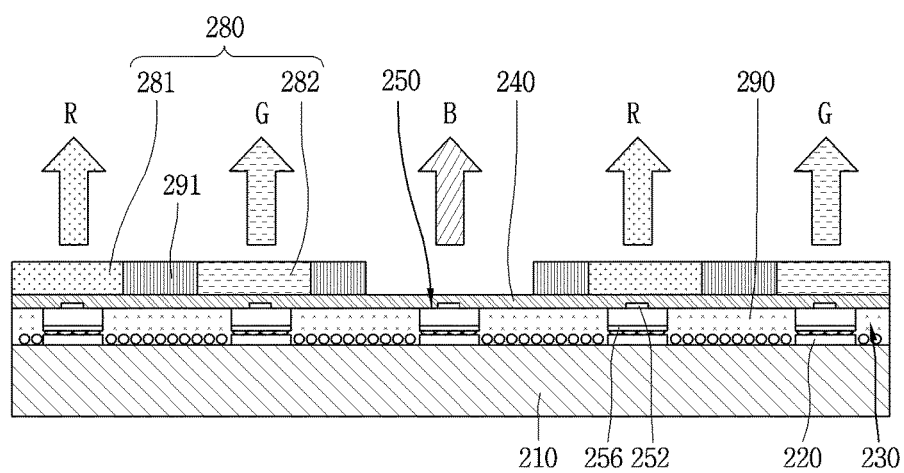
FIG. 8 is a cross-sectional view taken along line D-D in FIG. 7.
Figure 9:
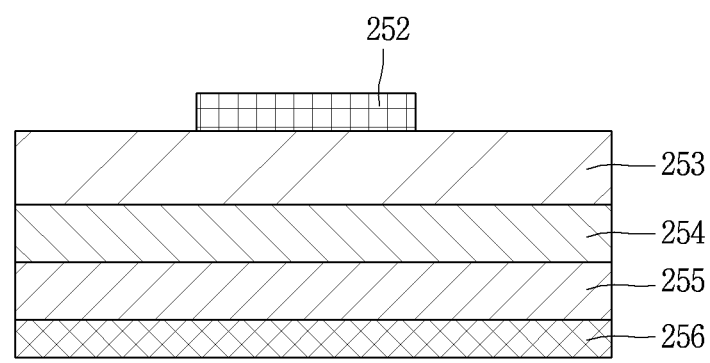
FIG. 9 is a conceptual view illustrating a vertical type semiconductor light emitting device in FIG. 8.

FIG. 7 is a perspective view illustrating a display device using a semiconductor light emitting device according to another embodiment of the present disclosure, FIG. 8 is a cross-sectional view taken along line C-C in FIG. 7, and FIG. 9 is a conceptual view illustrating a vertical type semiconductor light emitting device in FIG. 8.

According to the illustrations, the display device is using a passive matrix (PM) type of a vertical semiconductor light emitting device. As shown, the display device includes a substrate 210, a first electrode 220, a conductive adhesive layer 230, a second electrode 240 and a plurality of semiconductor light emitting devices 250.

The substrate 210 as a wiring substrate disposed with the first electrode 220 can include polyimide (PI) to implement a flexible display device. In addition, any material can be used if it is an insulating and flexible material. Further, the first electrode 220 can be located on the substrate 210, and formed with a bar-shaped electrode elongated in one direction. The first electrode 220 can be formed to perform the role of a data electrode.

The conductive adhesive layer 230 is formed on the substrate 210 located with the first electrode 220. Similarly to a display device to which a flip chip type light emitting device is applied, the conductive adhesive layer 230 can be an anisotropic conductive film (ACF), an anisotropic conductive paste, a solution containing conductive particles, and the like. However, the present embodiment illustrates the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. In addition, the semiconductor light emitting device 250 are preferably disposed on the first electrode 220.

Further, the electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof. Furthermore, the anisotropic conductive film contains an adhesive component, and thus the conductive adhesive layer 230 implements a mechanical coupling as well as an electrical coupling between the semiconductor light emitting device 250 and the first electrode 220.

Thus, the semiconductor light emitting device 250 is placed on the conductive adhesive layer 230, thereby configuring a separate sub-pixel in the display device. The semiconductor light emitting device 250 has excellent luminance characteristics, and thus it is possible to configure individual sub-pixels even with a small size thereof. The size of the individual semiconductor light emitting device 250 can be less than 80 µm in the length of one side thereof, and formed with a rectangular or square shaped element. In case of a rectangular shaped element, the size thereof can be less than 20×80 µm. The semiconductor light emitting device 250 can also be a vertical structure.

A plurality of second electrodes 240 disposed in a direction of crossing the length direction of the first electrode 220, and electrically connected to the vertical semiconductor light emitting device 250 can be located between vertical semiconductor light emitting devices.

Referring to FIGS. 7 through 9, the vertical semiconductor light emitting device can include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof can be electrically connected to the first electrode 220 by the conductive adhesive layer 230, and the n-type electrode 252 located at the top thereof can be electrically connected to the second electrode 240 which will be described later. The electrodes can be disposed in the upward/downward direction in the vertical semiconductor light emitting device 250, thereby providing a great advantage capable of reducing the chip size.

Referring again to FIG. 8, a phosphor layer 280 can be formed on one surface of the semiconductor light emitting device 250. For example, the semiconductor light emitting device 250 is a blue semiconductor light emitting device 250 that emits blue (B) light, and the phosphor layer 280 for converting the blue (B) light into the color of the sub-pixel can be provided thereon. In this instance, the phosphor layer 280 can be a red phosphor 281 and a green phosphor 282 constituting individual pixels.

In other words, a red phosphor 281 capable of converting blue light into red (R) light can be deposited on the blue semiconductor light emitting device 251 at a location implementing a red sub-pixel, and a green phosphor 282 capable of converting blue light into green (G) light can be deposited on the blue semiconductor light emitting device 251 at a location implementing a green sub-pixel. Furthermore, only the blue semiconductor light emitting device 250 can be solely used at a location implementing a blue sub-pixel. In this instance, the red (R), green (G) and blue (B) sub-pixels can implement one pixel.

However, the present disclosure is not limited to this, and another structure for implementing blue, red and green can be also applicable thereto as described above in a display device to which a flip chip type light emitting device is applied. Taking the present embodiment into consideration again, the second electrode 240 is located between the semiconductor light emitting devices 250, and electrically connected to the semiconductor light emitting devices 250. For example, the semiconductor light emitting devices 250 can be disposed in a plurality of rows, and the second electrode 240 can be located between the rows of the semiconductor light emitting devices 250.

Since a distance between the semiconductor light emitting devices 250 constituting individual pixels is sufficiently large, the second electrode 240 can be located between the semiconductor light emitting devices 250. The second electrode 240 can also be formed with a bar-shaped electrode elongated in one direction, and disposed in a perpendicular direction to the first electrode.

Furthermore, the second electrode 240 can be electrically connected to the semiconductor light emitting device 250 by a connecting electrode protruded from the second electrode 240. More specifically, the connecting electrode can be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 can be electrically connected to the n-type electrode of the semiconductor light emitting device 250.

According to the illustration, the second electrode 240 can be located on the conductive adhesive layer 230. A transparent insulating layer containing silicon oxide (SiOx) can also be formed on the substrate 210 formed with the semiconductor light emitting device 250. When the transparent insulating layer is formed and then the second electrode 240 is placed thereon, the second electrode 240 can be located on the transparent insulating layer. Furthermore, the second electrode 240 can be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 can be placed between the semiconductor light emitting devices 250, thereby obtaining an advantage in which the transparent electrode is not required. In addition, an n-type semiconductor layer and a conductive material having a good adhesiveness can be used as a horizontal electrode without being restricted by the selection of a transparent material, thereby enhancing the light extraction efficiency.

According to the illustration, a partition wall 290 can be formed between the semiconductor light emitting devices 250. In other words, the partition wall 290 can be disposed between the vertical semiconductor light emitting devices 250 to isolate the semiconductor light emitting device 250 constituting individual pixels. The partition wall 290 divides individual sub-pixels from one another, and can be formed as an integral body with the conductive adhesive layer 230. For example, a base member of the anisotropic conductive film can form the partition wall when the semiconductor light emitting device 250 is inserted into the anisotropic conductive film.

When the base member of the anisotropic conductive film is black, the partition wall 290 can have reflective characteristics while at the same time increasing contrast with no additional black insulator. In another example, a reflective partition wall can be separately provided with the partition wall 290. In this instance, the partition wall 290 can include a black or white insulator according to the purpose of the display device.

If the second electrode 240 is precisely located on the conductive adhesive layer 230 between the semiconductor light emitting devices 250, the partition wall 290 can be located between the semiconductor light emitting device 250 and second electrode 240. Accordingly, individual sub-pixels can be configured even with a small size using the semiconductor light emitting device 250, and a distance between the semiconductor light emitting devices 250 can be relatively sufficiently large to place the second electrode 240 between the semiconductor light emitting devices 250, thereby having the effect of implementing a flexible display device having a HD image quality. According to the illustration, a black matrix 291 can be disposed between each phosphor layer to enhance contrast. In other words, the black matrix 191 can enhance the contrast of luminance.

As described above, the semiconductor light emitting devices 250 are located on the conductive adhesive layer 230, thereby constituting individual pixels on the display device. Since the semiconductor light emitting device 250 has excellent luminance characteristics, individual sub-pixels can be configured even with a small size thereof. As a result, a full color display can be implemented in which the sub-pixels of red (R), green (G) and blue (B) implement one pixel by the semiconductor light emitting device.

In a display using the foregoing semiconductor light emitting device of an embodiment of the present disclosure, a semiconductor light emitting device grown on a growth substrate is transferred to a wiring substrate using an anisotropic conductive film (ACF). However, such a method has a disadvantage in that it is difficult to secure fabrication reliability and its fabrication cost is high. In particular, for digital signage, the property of flexibility may not be required, and thus a different approach is required for a display using a semiconductor light emitting device.

Hereinafter, in order to overcome the foregoing technical difficulties and implement a high-resolution display based on an ultra-small micro light emitting diode, embodiments of the present disclosure provide a pixel structure for a display based on an ultra-small blue light emitting diode and a fabrication method thereof. More specifically, an embodiment of the present disclosure can form a gallium nitride thin layer on a silicon substrate using a GaN-on-Si technology, and etch the gallium nitride thin layer to form a micro light emitting diode structure, and then etch the growth substrate to form a partition wall structure, thereby implementing a high-resolution micro light emitting diode structure. Thus, the high-resolution micro light emitting diode structure implemented on a wafer can be used as a display itself, and separated into individual chips and attached to a wider substrate to use it as a large-sized display.

Hereinafter, a display device according to another embodiment of the present disclosure in which a growth substrate is etched and used as a partition wall structure will be described in detail with reference to the drawings. In particular, FIG. 10 is a partial perspective view illustrating another embodiment of the present disclosure, FIG. 11 is a cross-sectional view taken along line E-E in FIG. 10, and FIG. 12 is a cross-sectional view taken along line F-F in FIG. 10.

Figure 10:
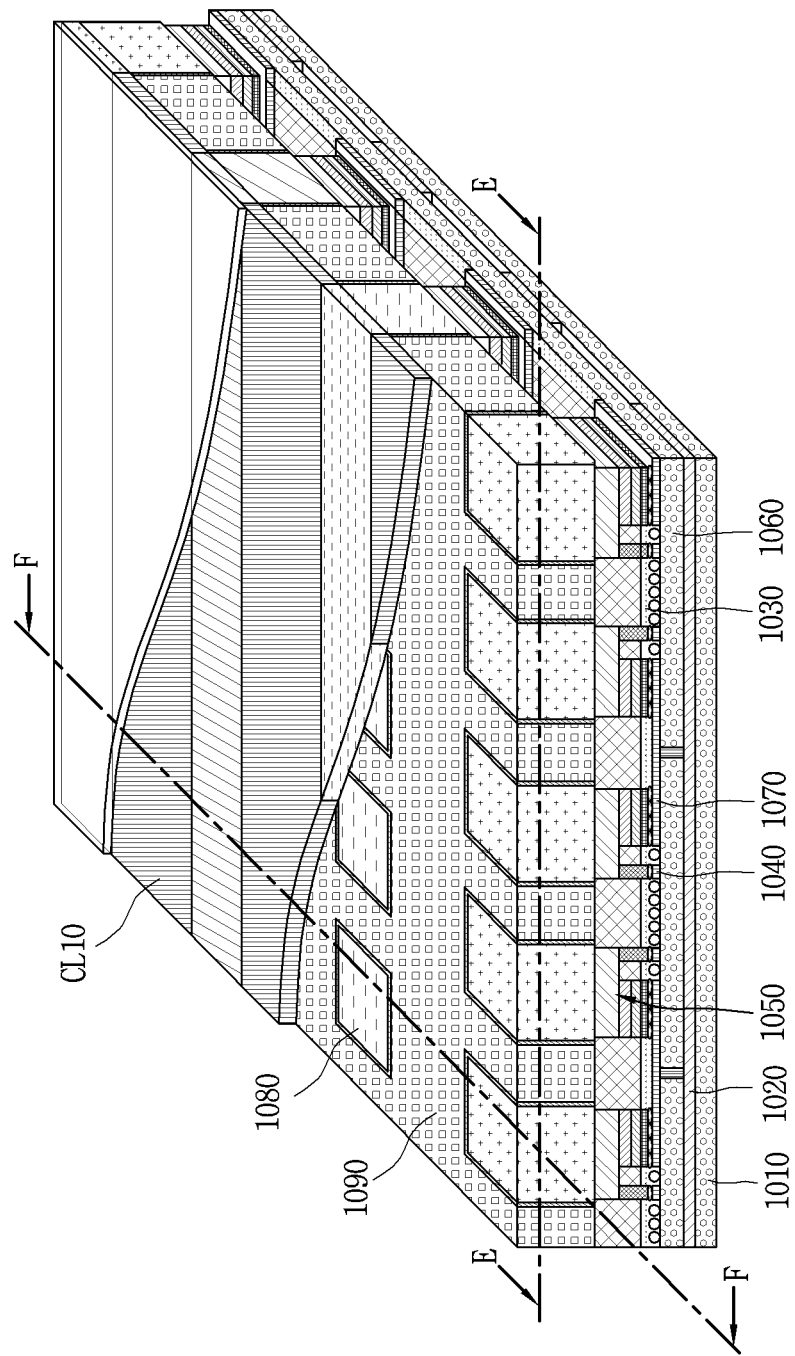
FIG. 10 is a partial perspective view illustrating another embodiment of the present disclosure.
Figure 11:
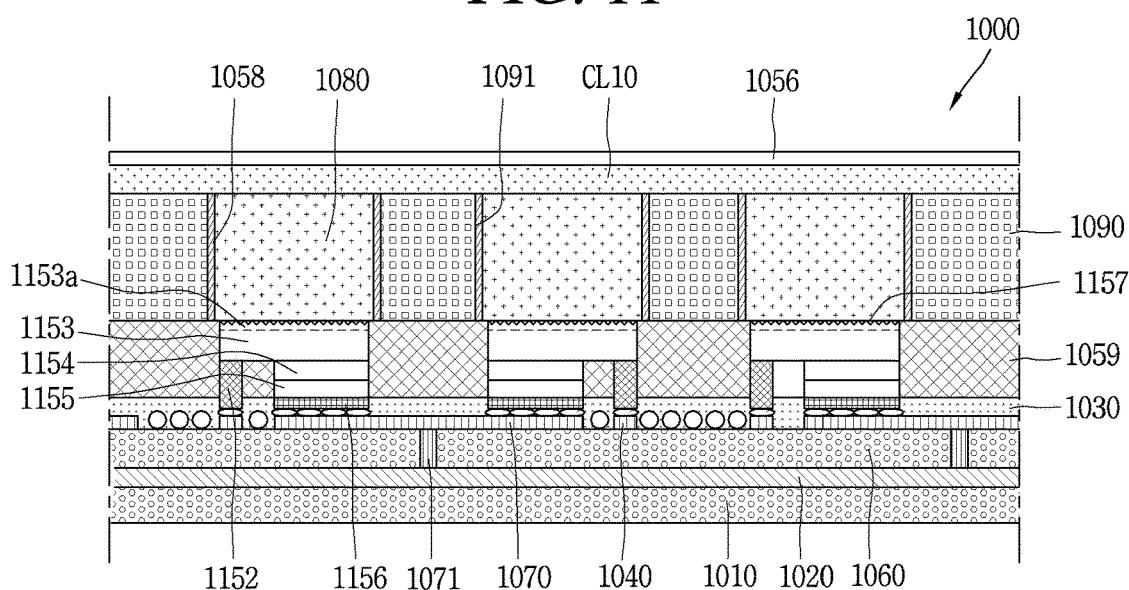
FIG. 11 is a cross-sectional view taken along line E-E in FIG. 10.
Figure 12:
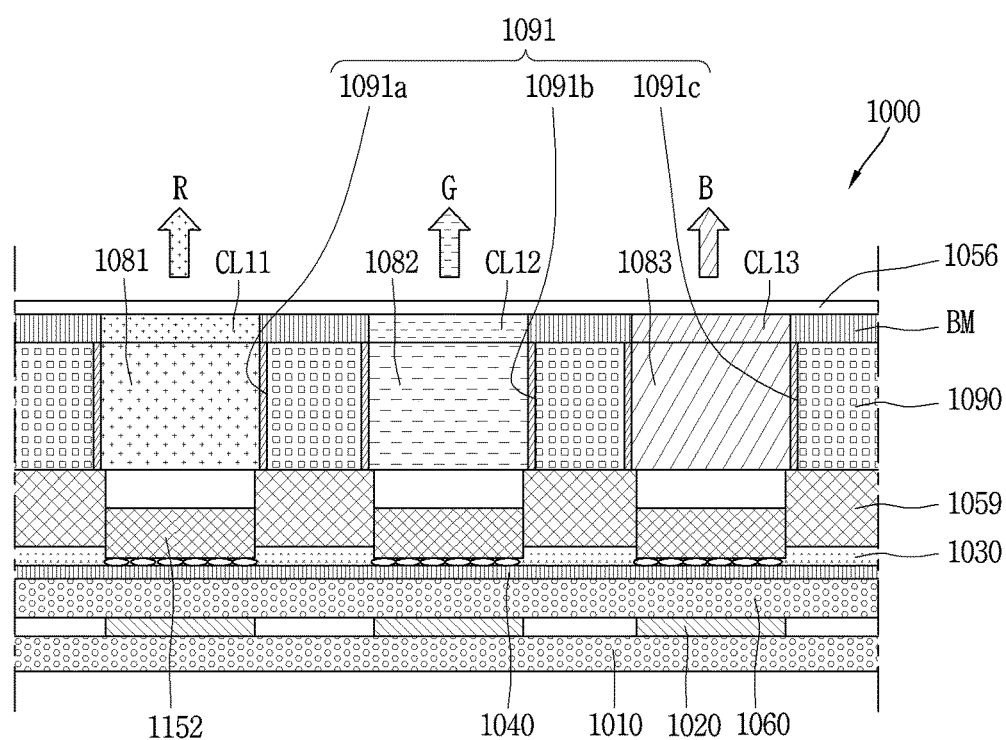
FIG. 12 is a cross-sectional view taken along line F-F in FIG. 10.

According to the illustrations of FIGS. 10 through 12, a display device 1000 using a passive matrix (PM) type semiconductor light emitting device is illustrated. However, an example described below can also be applicable to an active matrix (AM) type semiconductor light emitting device.

The display device 1000 can include a substrate 1010, a first electrode 1020, a conductive adhesive layer 1030, a second electrode 1040, a growth substrate 1090 (FIG. 13A), and a plurality of semiconductor light emitting devices 1050. Here, the first electrode 1020 and the second electrode 1040 can include a plurality of electrode lines, respectively.

The substrate 1010 can be a wiring substrate disposed with the first electrode 1020, and thus the first electrode 1020 can be located at the substrate 1010. In this instance, the substrate 1010 can be formed of an insulating but non-flexible material. In addition, the substrate 1010 can be formed of a transparent material or non-transparent material.

According to the illustration, the insulating layer 1060 can be disposed on the substrate 1010 on which the first electrode 1020 is positioned, and an auxiliary electrode 1070 can be disposed on the insulating layer 1060. In this instance, a state in which the insulating layer 1060 is layered on the substrate 1010 can be a single wiring substrate. More specifically, the insulating layer 1060 can be made of an insulating material such as polyimide (PI), PET, PEN, or the like, and integrally formed with the substrate 1010 to form a single substrate.

The auxiliary electrode 1070 electrically connects the first electrode 1020 and the semiconductor light emitting device 1050, is located at the insulating layer 1060, and is disposed to correspond to the position of the first electrode 1020. For example, the auxiliary electrode 1070 can be formed in a dot shape and electrically connected to the first electrode 1020 by an electrode hole 1071 passing through the insulating layer 1060. The electrode hole 1071 can be formed by filling a via hole with a conductive material.

Referring to the present drawings, a conductive adhesive layer 1030 is formed on one surface of the insulating layer 1060, but the present disclosure is not limited thereto. For example, an electrode of the semiconductor light emitting device can be coupled to a wiring electrode by soldering or the like. In this instance, the conductive adhesive layer in this example can be excluded.

In this example, the conductive adhesive layer 1030 is formed on the substrate 1010 at which the first electrode 1020 is located. As illustrated in a display device to which the foregoing flip chip type light emitting device is applied, the conductive adhesive layer can be an anisotropic conductive film (ACF) 1030. Referring again to the drawing, the second electrode 1040 is located at the insulating layer 1060 separated from the auxiliary electrode 1070. In other words, the conductive adhesive layer 1030 is disposed on the insulating layer 1060 at which the auxiliary electrode 1070 and the second electrode 1040 are located.

When the conductive adhesive layer 1030 is formed in a state that the auxiliary electrode 1070 and the second electrode 1040 are located at the insulating layer 1060, and then heat and pressure is applied to the semiconductor light emitting device 1050 to be connected thereto the semiconductor light emitting device 1050 in a flip-chip form, the semiconductor light emitting device 1050 is electrically connected to the first electrode 1020 and the second electrode 1040.

The plurality of semiconductor light emitting devices 1050 can have the foregoing structure with reference to FIG. 4, and be mostly formed of gallium nitride (GaN), and indium (In) and/or aluminum (Al) can be added thereto to implement a high-power light emitting device that emits blue light. For example, the plurality of semiconductor light emitting devices 1050 can be gallium nitride thin layers formed with various layers, such as n-Gan, p-Gan, AlGaN, InGan, and the like. However, the present disclosure is not limited thereto, and the plurality of semiconductor light emitting devices can be implemented as light emitting devices that emit green light.

More specifically, the semiconductor light emitting device includes a p-type electrode 1156, a p-type semiconductor layer 1155 on which the p-type electrode 1156 is formed, an active layer 1154 formed on the p-type semiconductor layer 1155, an n-type semiconductor layer 1153 formed on the active layer 1154, and an n-type electrode 1152 disposed on the n-type semiconductor layer 1153 to be spaced apart in a vertical direction to the p-type electrode 1156. In this instance, the p-type electrode 1156 can be electrically connected to the auxiliary electrode 1070 by the conductive adhesive layer 1030, and the n-type electrode 1152 can be electrically connected to the second electrode 1040.

According to the illustration, a protective layer 1059 can be layered on the conductive adhesive layer 1030. The protective layer 1059 is formed to fill between the semiconductor light emitting devices, and formed on one surface of the growth substrate 1090 to form an upper protective layer. The protective layer 1059 can include a material having a high light reflectivity to remove optical interference between individual elements and enhance light extraction. For example, the protective layer 1059 can include a resin and reflective particles. The resin can be layered on the conductive adhesive layer 1030 to fill between the plurality of semiconductor light emitting devices, and the reflective particles can be mixed into the resin.

Further, the resin can include at least one of acryl, epoxy, polyimide, a coating mixture of polymers, and a photoresist. Meanwhile, the resin can be formed of the same material as that of an insulating base member of the conductive adhesive layer 1030. In this instance, the resin and the conductive adhesive layer 1030 can be integrally formed by adhesion.

The reflective particles can include at least one of titanium oxide, alumina, magnesium oxide, antimony oxide, zirconium oxide, and silica. Further, the reflective particles can be a white pigment. In addition, the wiring substrate 1010 electrically connected to the electrodes of the semiconductor light emitting device is disposed on an opposite side of the growth substrate 1090 by interposing the semiconductor light emitting device therebetween.

Further, the growth substrate 1090 is grown to allow gallium nitride to grow. For example, the growth substrate 1090 can be formed of a carrier wafer, a material suitable for semiconductor material growth. The growth substrate 1090 can be formed of a material having an excellent thermal conductivity including a conductive substrate or insulating substrate. For example, a SiC substrate having a higher thermal conductivity compared to a sapphire ($Al_2O_3$) substrate or at least one of Si, GaAs, GaP, InP and $Ga_2O_3$ can be used.

In this example, the growth substrate 1090 can be a silicon substrate having a silicon material. As described above, because the substrate is based not on a sapphire substrate but on a silicon substrate, and the substrate can be used as a partition wall structure. Specifically, in this example, the n-type semiconductor layer 1153 of the semiconductor light emitting device is disposed on one surface of the growth substrate 1090 to allow the semiconductor light emitting device to grow, and a protective layer 1059 can be coated on the one surface to fill between the individual devices.

In addition, because the growth substrate 1090 is an etchable silicon substrate, the through holes 1091 can be formed by the etching. The through hole 1091 passes through the growth substrate 1090 at a position overlapping with the semiconductor light emitting device. A plurality of through holes 1091 can be provided to correspond to each of the semiconductor light emitting devices.

For the semiconductor light emitting device, a first semiconductor light emitting device, a second semiconductor light emitting device, and a third semiconductor light emitting device, which emit blue light, can be sequentially arranged at preset intervals based on subpixels, and a first through holes 1091*a*, a second through hole 1091*b* and a third through hole 1091*c* can be sequentially arranged in a corresponding manner at the same interval as the preset interval. This arrangement can be applicable in a horizontal direction and a vertical direction, respectively. For example, the through holes 1091 can be sequentially arranged in a horizontal direction and a vertical direction, respectively, to form a lattice structure. However, the present disclosure is not limited thereto. The through hole 1091 can be formed as a long slit in one direction, and the slits can be sequentially arranged in a horizontal direction or vertical direction.

Meanwhile, according to the illustration, the through-hole 1091 can be filled with a wavelength conversion material 1080 for converting a wavelength of light emitted from the semiconductor light emitting device. In this instance, the wavelength conversion material 1080 converts the blue (B) light into a color of a sub-pixel or converting it into a color of yellow or white. For example, the wavelength conversion material 1080 can include a green phosphor 1081 and a red phosphor 1082. However, the present disclosure is not limited thereto, and instead of the phosphors, a quantum dot (QD) can be filled into the through holes to implement a sub-pixel emitting red (R), green (G), and blue (B).

Further, a red phosphor 1081 capable of converting blue light into red (R) light can be layered on a blue semiconductor light emitting device at a position forming a red pixel, and a green phosphor 1082 capable of converting blue light into green (G) light can layered on the blue semiconductor light emitting device at a position forming the green pixel. According to the illustration, the red phosphor 1081 is filled into the first through hole 1091*a*, and the green phosphor 1082 is filled into the second through hole 1091*b*. In this instance, a light transmitting material 1083 can be filled into the third through-hole 1091*c* as a position forming a blue pixel. The light transmitting material 1083 is a material having a high transmittance in a visible light region, for example, epoxy-based PR (photoresist), PDMS (polydimethylsiloxane), resin, or the like can be used.

In this instance, at least part of the through hole 1091 can overlap with the protective layer 1059 in a thickness direction of the growth substrate 1090 so the phosphor or the light transmitting material completely covers the semiconductor light emitting device. The protective layer 1059 can also be formed of an adhesive material to fix the semiconductor light emitting device even if the through hole 1091 is formed.

Figure 14A:
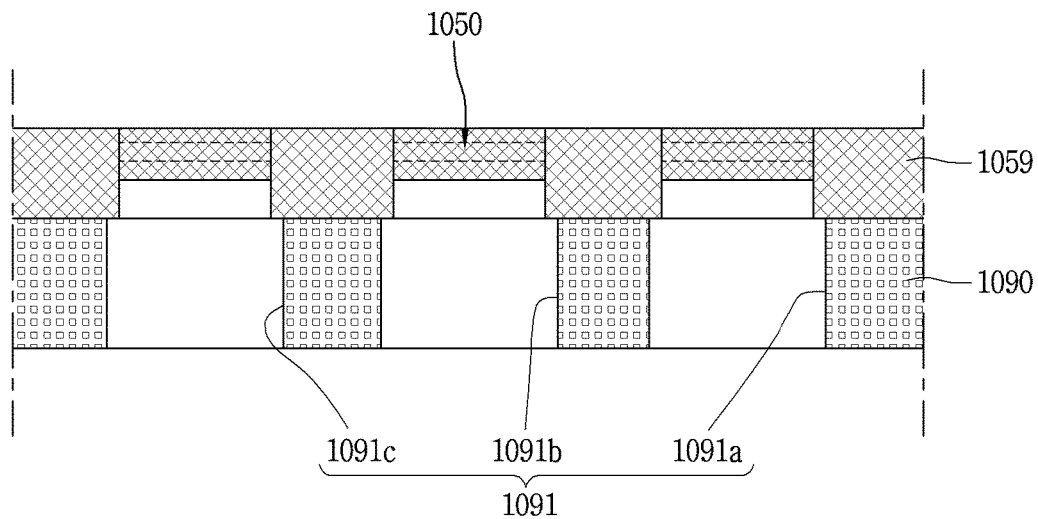
Figure 14B:
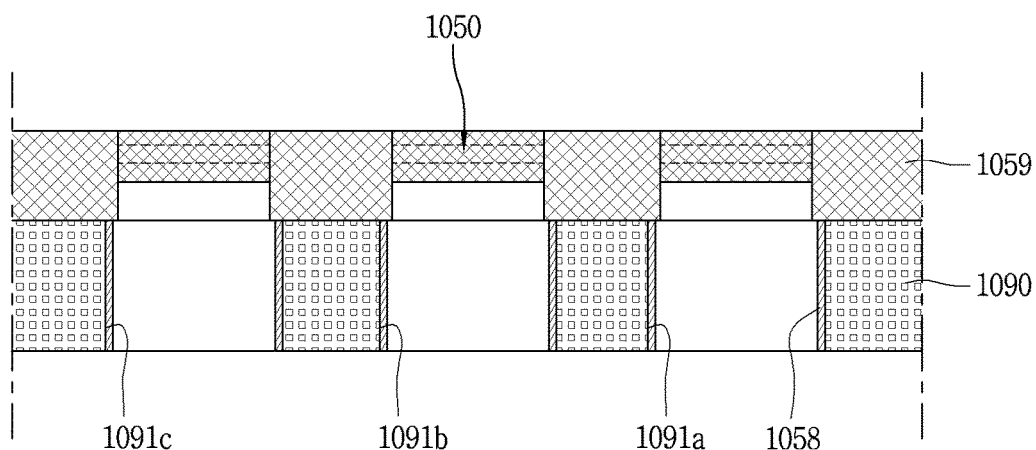
Figure 14C:
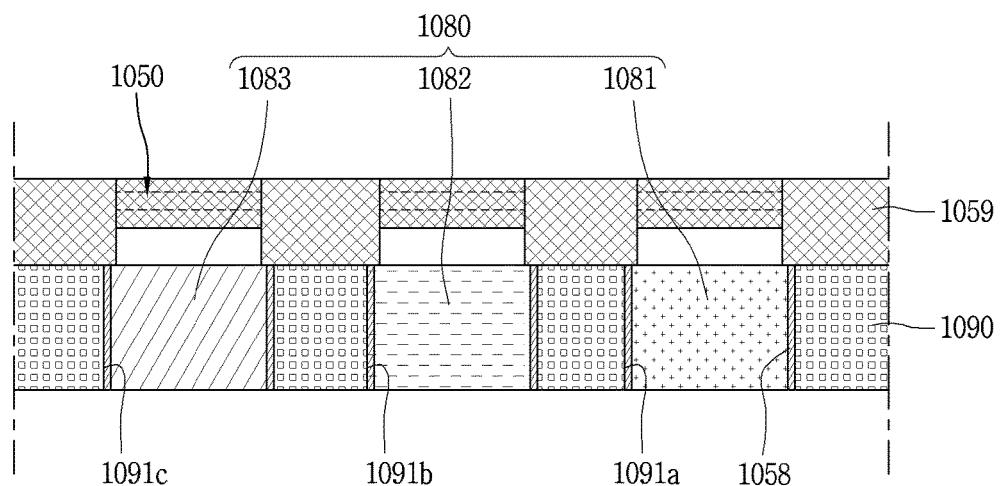

According to such a structure, the growth substrate 1090 forms a partition wall between the red phosphor 1081 and the green phosphor 1082. In addition, the growth substrate 1090 also forms partition walls at both sides of the light transmitting material 1083 (FIG. 14C). Here, since the through holes 1091 are formed in a lattice structure, the growth substrate 1090 can form partition walls between the phosphors along a vertical direction and a horizontal direction, respectively.

According to the illustration, a color filter (CL10) is disposed to cover the wavelength conversion material. For example, the color filter (CL10) for filtering light emitted from the wavelength conversion material can be disposed on the other surface of the growth substrate 1090 to overlap with the through hole. In this instance, the color filter (CL10) is made to selectively transmit light to implement red, green and blue colors, and the phosphor and the color filter (CL10) can be combined to implement the red, green, and blue sub-pixels.

The color filter (CL10) can be provided with a plurality of filtering portions (CL11, CL12, CL13) for filtering a red wavelength, a green wavelength, and a blue wavelength to have a structure in which the plurality of filtering portions (CL11, CL12, CL13) are repeatedly arranged. In addition, the plurality of filtering portions (CL11, CL12, CL13) can be formed as lines elongated in one direction, and sequentially arranged at preset intervals in the other direction perpendicular to the one direction. In other words, the color filters (CL10) can be arranged in a line form, whereas the phosphors filled into the through holes are arranged in a lattice form.

Here, a red filtering portion (CL11) and a green filtering portion (CL12) for filtering red and green can be arranged on the red phosphor and the green phosphor, respectively, and a blue filtering portion (CL13) can be arranged to cover a light transmitting material at a portion that forms a blue pixel. A black matrix (BM10) covering the other surface of the growth substrate is disposed between the color filters. For example, the black matrix (BM) can be disposed between the plurality of filtering portions.

In another example, a yellow phosphor other than red or green phosphor can be filled into all through holes, and a color filter repeated with red, green and blue can be arranged to cover the yellow phosphor. Furthermore, according to the embodiment, a lower protective layer 1056 can be coated to cover the color filter and the black matrix to protect the device. The lower protective layer 1056 is formed of a light transmitting material.

According to the illustration, the reflective layer 1058 is formed on an inner wall of the through hole 1091. In this instance, the phosphor 1080 can be surrounded by the reflective layer 1058. More specifically, the light transmitting material 1083 or phosphor 1081, 1082 is formed to be filled into a space between the reflective layers 1058. In this instance, the reflective layer 1058 is formed to completely cover an inner wall of the through hole 1091.

In addition, one surface of the semiconductor light emitting device closest to the through hole 1091 can be formed with a textured surface. Thus, an undoped semiconductor layer 1153a can be formed on one surface of the n-type semiconductor layer 1153 of the semiconductor light emitting device. For example, the undoped semiconductor layer 1153a can have grooves 1157 formed on one surface farthest from the p-type electrode 1156. The grooves 1157 can be etched to be textured on one surface farthest from the p-type electrode 1156. According to an embodiment of the present disclosure, texturing on a surface of the semiconductor light emitting device can be performed by etching grooves on the undoped semiconductor layer 1153a.

According to the foregoing structure, it is possible to implement a display device with a novel structure in which a process of removing the growth substrate is not required. Meanwhile, the display device can be fabricated by a new method.

Figure 13A:
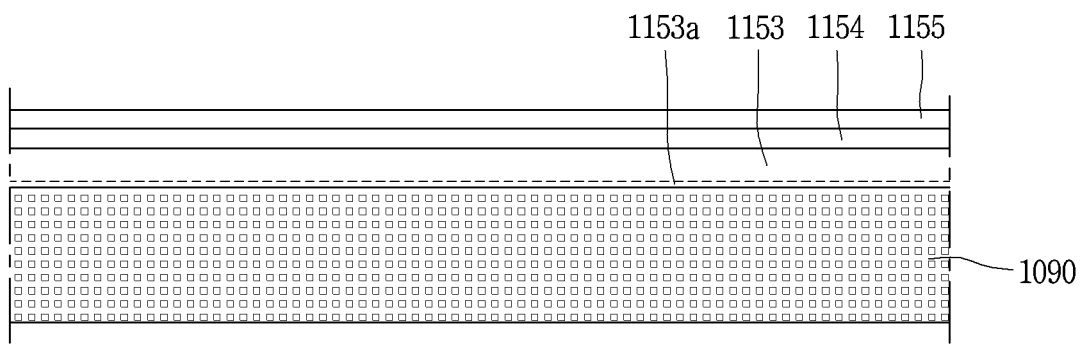
FIGS. 13A through 13D and 14A through 14F are conceptual views illustrating a fabrication method of a display device in FIG. 10.

Hereinafter, a fabrication method applied to the present disclosure will be described with reference to the drawings. In particular, FIGS. 13A through 13D and 14A through 14F are conceptual views illustrating a fabrication method of a display device in FIG. 10. First, according to the fabrication method, an n-type semiconductor layer 1153, an active layer 1154, and a p-type semiconductor layer 1155 are grown on a growth substrate 1090 (FIG. 13A).

The growth substrate 1090 (wafer) can be a substrate on which the semiconductor light emitting device is grown, and the growth substrate can be a silicon substrate capable of growing the gallium nitride and allowing etching for the through hole. As described above, the substrate is not based on a sapphire substrate but on a silicon substrate, and the substrate can be used as a partition wall structure. In another example, the growth substrate 1090 can use a SiC substrate having high thermal conductivity, or at least one of GaAs, GaP, InP, and $Ga_2O_3$ as a carrier wafer suitable for semiconductor material growth.

In this instance, the silicon substrate is a substrate for growing a suitable gallium nitride thin layer, and a crystallinity, a size, a thickness, or the like thereof is not limited as long as it is suitable for the growth of the gallium nitride thin layer. When the n-type semiconductor layer 1153 is grown, the active layer 1154 is then grown on the n-type semiconductor layer 1153, and the p-type semiconductor layer 1155 is then grown on the active layer 1154. Each semiconductor layer can include gallium nitride. Here, prior to the growth of the n-type semiconductor layer 1153, the undoped semiconductor layer 1153a can be first grown.

When the undoped semiconductor layer 1153a, the n-type semiconductor layer 1153, the active layer 1154 and the p-type semiconductor layer 1155 are sequentially grown as described above, a layered structure of micro semiconductor light emitting devices is formed as illustrated in FIG. 13A. In this example, a semiconductor can be grown as a layered structure of a blue semiconductor light emitting device.

The layered structure of the micro semiconductor light emitting device as a gallium nitride thin layer includes various layers such as n-GaN, p-GaN, AlGaN, and InGaN. In this instance, if the layered structure is grown without any problem in driving it as a light source, the composition, material, and thickness of the thin layer are suitably selected according to the purpose.

Figure 13B:
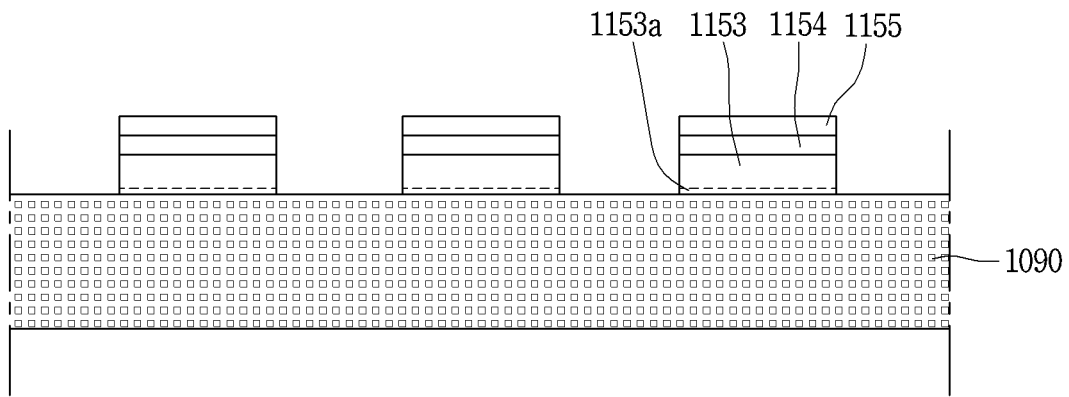

Next, at least part of the active layer 1154 and the p-type semiconductor layer 1155 are removed to expose at least part of the n-type semiconductor layer 1153 (FIG. 13B). More specifically, the formed gallium nitride thin layer is etched, passivated, or the like to form a structure of a unit light emitting diode having a size of several to several hundreds of micrometers. The unit structure can constitute one pixel or one sub-pixel. The present embodiment illustrates one pixel structure, in which three subpixels constitute one pixel.

In this instance, the active layer 1154 and the p-type semiconductor layer 1155 are partly removed in a vertical direction, and the n-type semiconductor layer 1153 is exposed to the outside. Through this, a mesa process of a plurality of light emitting devices is performed. Then, the n-type semiconductor layer 1153 and the undoped semiconductor layer 1153a are etched to isolate a plurality of light emitting devices so as to form a light emitting device array. Thus, the p-type semiconductor layer 1155, the active layer 1154, the n-type semiconductor layer 1153, and the undoped semiconductor layer 1153a are etched to form a plurality of micro semiconductor light emitting devices.

Figure 13C:
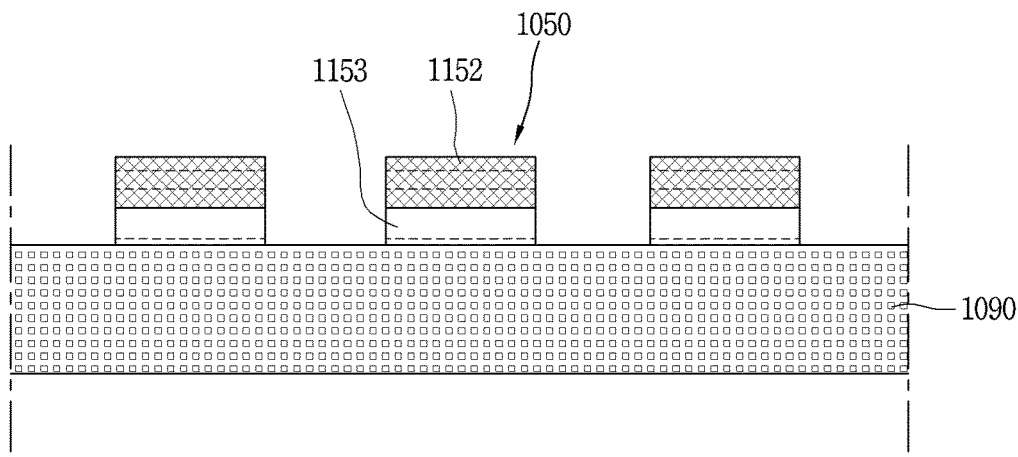

Next, electrodes are formed on the plurality of semiconductor light emitting devices to implement a flip chip type light emitting device. For example, an n-type electrode 1152 and a p-type electrode 1156 (refer to FIG. 11) are formed on the n-type semiconductor layer 1153 and the p-type semiconductor layer 1155, respectively (FIG. 13C). The n-type electrode 1152 and the p-type electrode 1156 can be formed by a deposition process such as sputtering, but the present disclosure is not limited thereto. Here, the n-type electrode 1152 can be the foregoing second conductive electrode, and the p-type electrode 1156 can be the first conductive electrode.

Figure 13D:
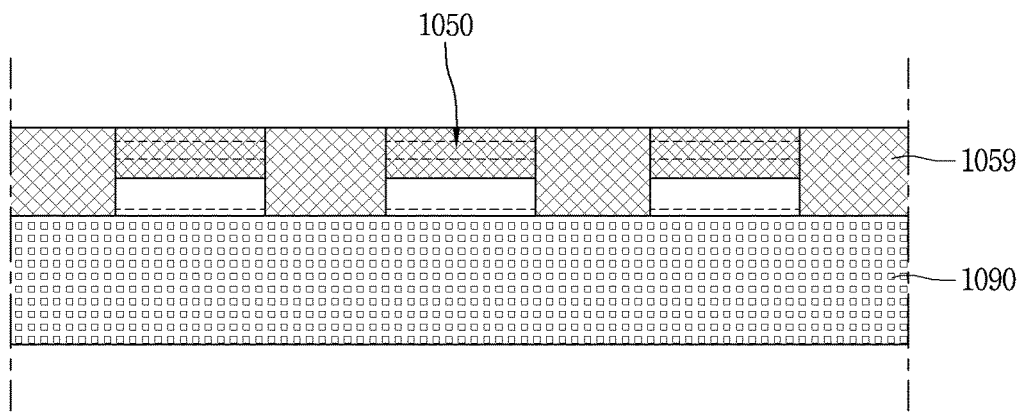

Next, a protective layer 1059 for filling between the semiconductor light emitting devices is formed on one surface of the growth substrate (FIG. 13D). The protective layer 1059 is formed on one surface of the growth substrate 1090 to form an upper protective layer. The protective layer 1059 can be formed of a material having high light reflectivity to remove optical interference between individual elements and enhance light extraction.

Further, the protective layer 1059 is preferably made of a material having high light reflectivity to remove optical interference between individual elements and enhance light extraction, but the present disclosure is not limited thereto. For example, the protective layer 1059 can include a resin and reflective particles. In addition, the process of forming the upper protective layer can be performed by selecting an appropriate process.

When an upper fabrication is completed by the foregoing process, a lower processing is performed. First, the growth substrate is etched to form a through hole passing through the growth substrate at a position overlapping with the semiconductor light emitting device (FIG. 14A). A silicon etch cavity capable of filling a wavelength conversion material through etching is formed on a silicon substrate. For example, a through hole 1091 is formed by silicon etching, and the through hole 1091 passes through the growth substrate 1090 at a position overlapping with the semiconductor light emitting device.

Here, a metal having a high light reflectance can be coated with a suitable thickness at a portion where light reflection is expected, such as a side wall of a cavity. In other words, prior to filling the wavelength conversion material, the process of coating a reflective layer on an inner wall of the through hole can be performed (FIG. 14B).

Next, a wavelength conversion material 1080 for converting a wavelength of light emitted from the semiconductor light emitting device is filled into the through hole 1091 (FIG. 14C). For example, a phosphor can be filled into the through hole 1091 for color implementation. The phosphor is filled thereinto by typically mixing a transparent base material with phosphor particles in a weight ratio. The type, size, and weight ratio of a phosphor can have an effect on the color, and these factors can be selectively set by the user.

For example, a red phosphor 1081 capable of converting blue light into red (R) light can be layered on a blue semiconductor light emitting device at a position forming a red pixel, and a green phosphor 1082 capable of converting blue light into green (G) light can be layered on the blue semiconductor light emitting device at a position forming a green pixel. According to the illustration, the red phosphor 1081 can be filled into the first through hole 1091a, and the green phosphor 1082 can be filled into the second through hole 1091b. In this instance, the light transmitting material 1083 can be filled into the third through hole 1091c as a position forming a blue pixel.

Figure 14D:
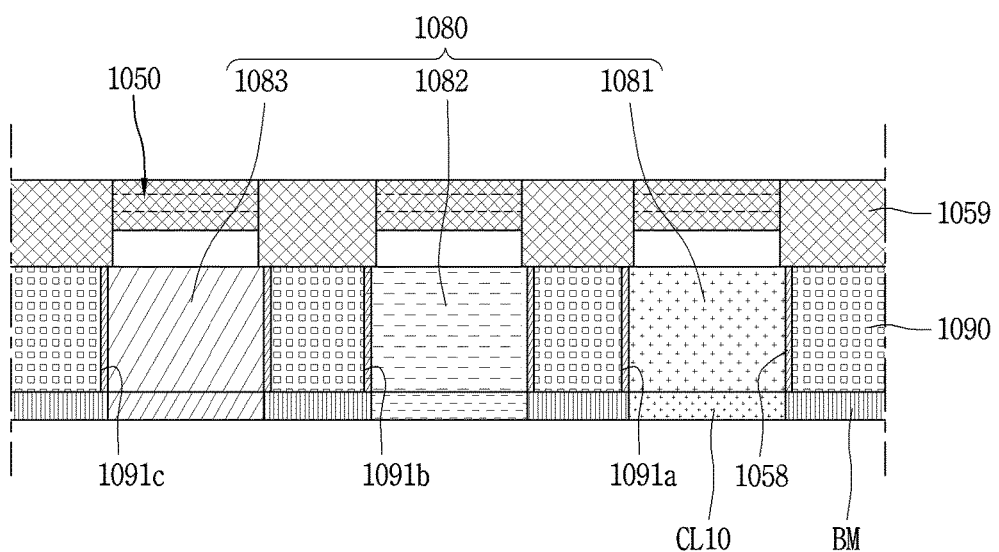

Next, a color filter (CL10) for filtering light emitted from the wavelength conversion material is attached to the other surface of the growth substrate to overlap with the through hole (FIG. 14D). An additional adhesive layer can be provided for the adhesion of the color filter (CL10), and the adhesive layer can include OCA, OCR, or the like. In this instance, the color filter (CL10) is made to selectively transmit light to implement red, green and blue colors, and the wavelength conversion material 1080 and the color filter (CL10) are combined to implement red, green, and blue sub-pixels.

Figure 14E:
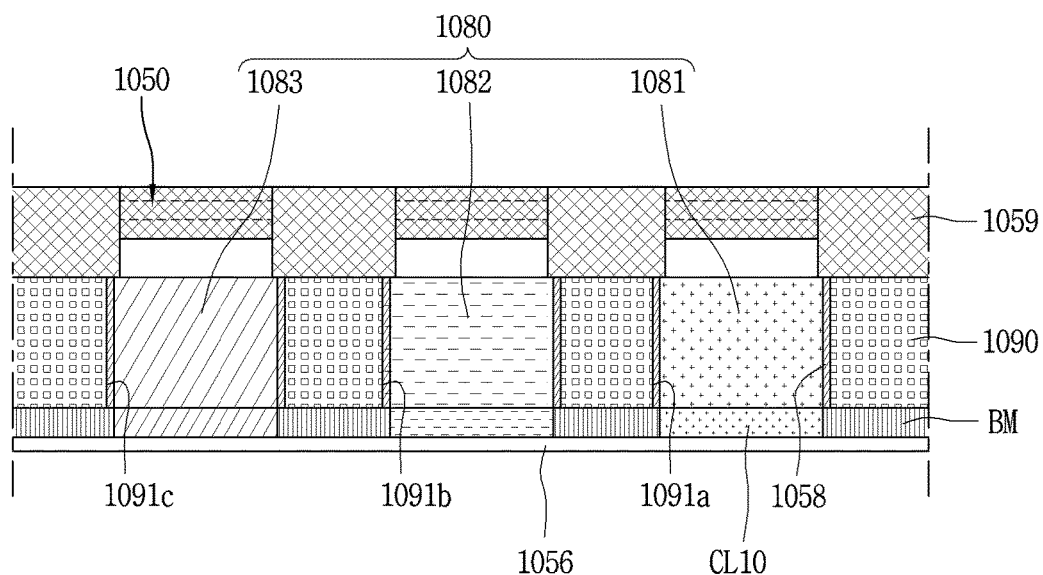

The color filter (CL10) can be applied to enhance the color quality of the display and remove residual blue light. In this instance, the color filter (CL10) can be selectively applied if color implementation subsequent to the phosphor conversion is sufficiently accurate. In addition, a black matrix (BM) can be covered at portions other than the portion where the color filter (CL10) is formed. The black matrix allows a higher quality display to have a higher contrast ratio. Finally, a lower protective layer 1056 is applied, thereby protecting the device (FIG. 14E).

Figure 14F:
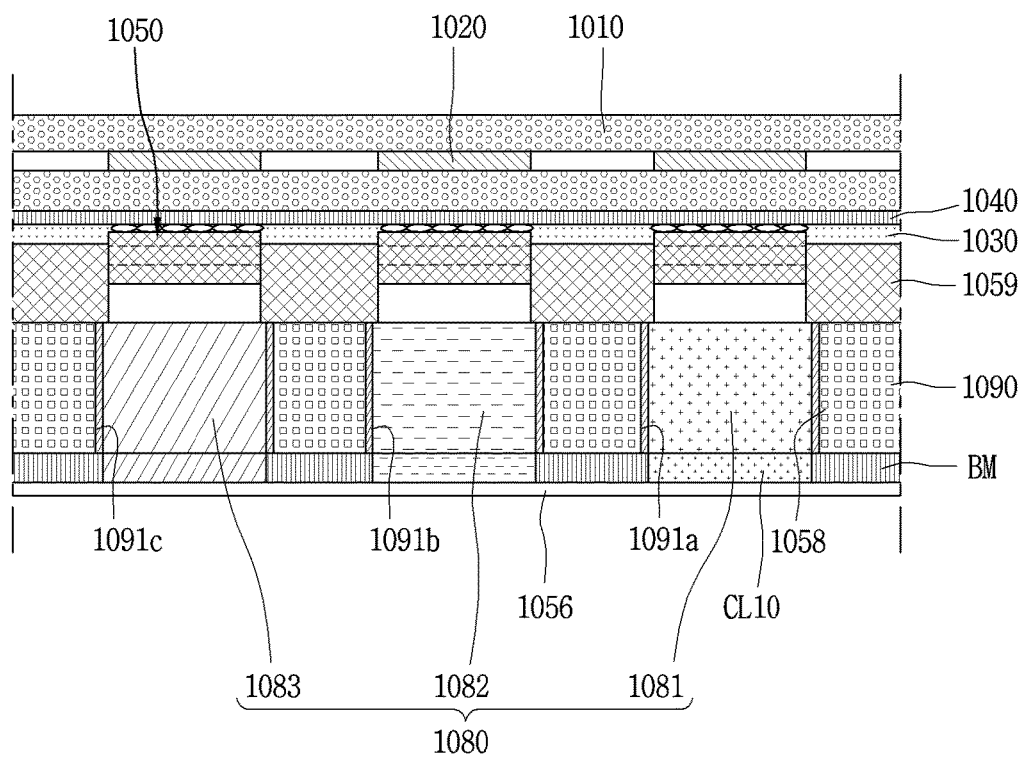

A structure fabricated by the foregoing method typically exists in an array form on a wafer. Hereinafter, such a structure will be referred to as a semiconductor light emitting device package. The semiconductor light emitting device package can be implemented as a display by cutting a part of the wafer or connecting the whole of the wafer to the wiring substrate 1010. For example, the semiconductor light emitting device package is coupled to the wiring substrate 1010 using the conductive adhesive layer 1030 (FIG. 14F).

The conductive adhesive layer 1030 can be formed, for example, by an anisotropic conductive film, and the anisotropic conductive film can be coated on the wiring substrate at which the insulating layer 1060 is located. Then, the wiring substrate 1010 and the semiconductor light emitting device package are thermally compressed. Further, the wiring substrate 1010 and the semiconductor light emitting device structure are bonded by the thermocompression. Thus, only a portion between the semiconductor light emitting device 1050 and the auxiliary electrode 1070 (refer to FIG. 11) and the second electrode 1040 have conductivity due to the characteristics of the anisotropic conductive film having conductivity by thermocompression, thereby allowing the semiconductor light emitting device 1050 to be electrically connected to the electrodes.

The fabrication method and structure of a display device using the semiconductor light emitting device described above can be modified into various forms. For example, the display device described above can be attached to a wiring substrate by metal soldering without the conductive adhesive layer. Furthermore, the semiconductor light emitting device package can be used by cutting a part on the wafer.

The cut package can include three subpixels, and the three subpixels constitute one RGB pixel. According to this structure, the fabrication method can further include partitioning the growth substrate into a plurality of unit substrates, and coupling the unit substrates to a wiring substrate at preset intervals. Hereinafter, a coupling structure of a unit substrate that can be implemented by such a fabrication method will be described with reference to the drawings.

Figure 15:
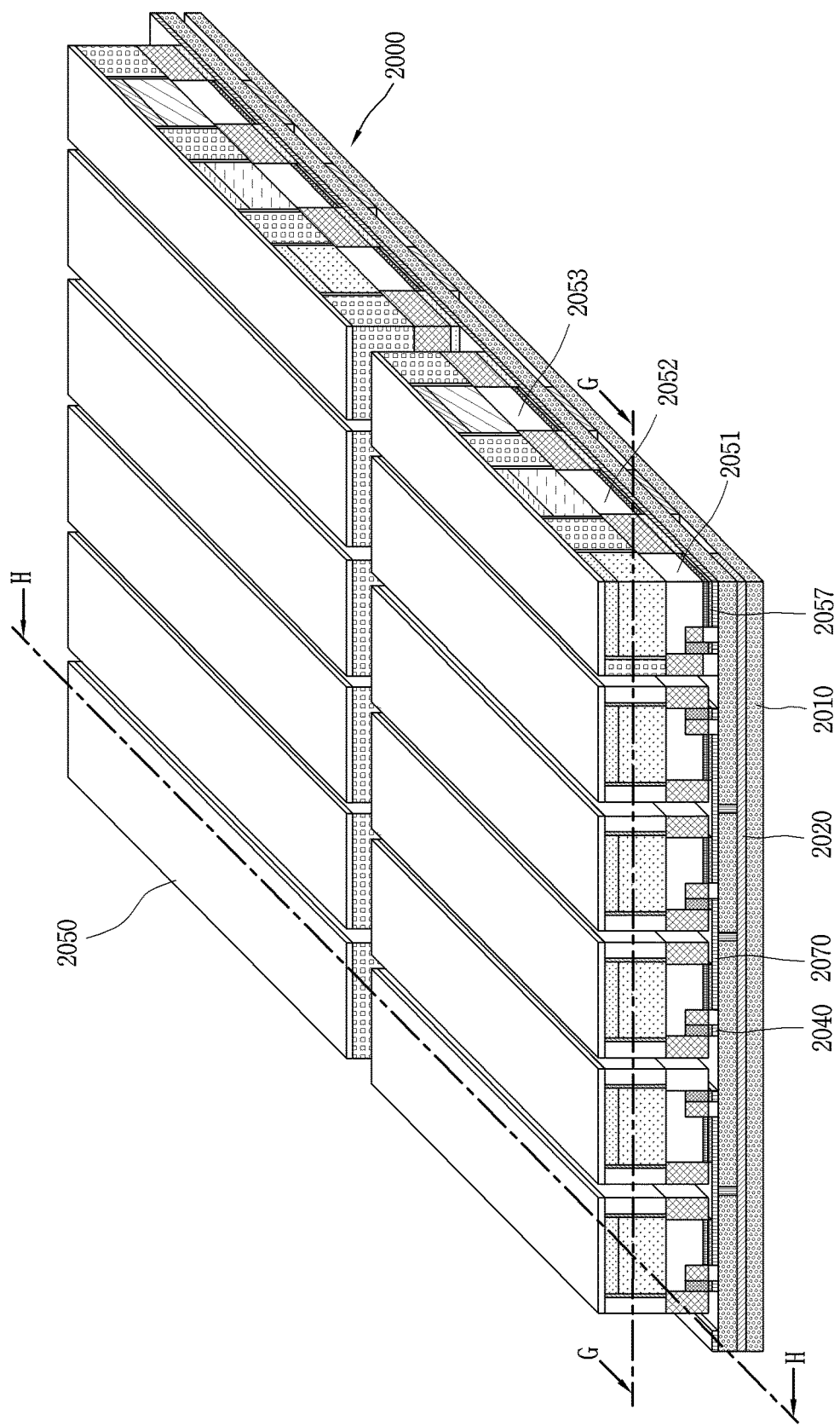
FIG. 15 is a partial perspective view illustrating still another embodiment of the present disclosure.
Figure 16:
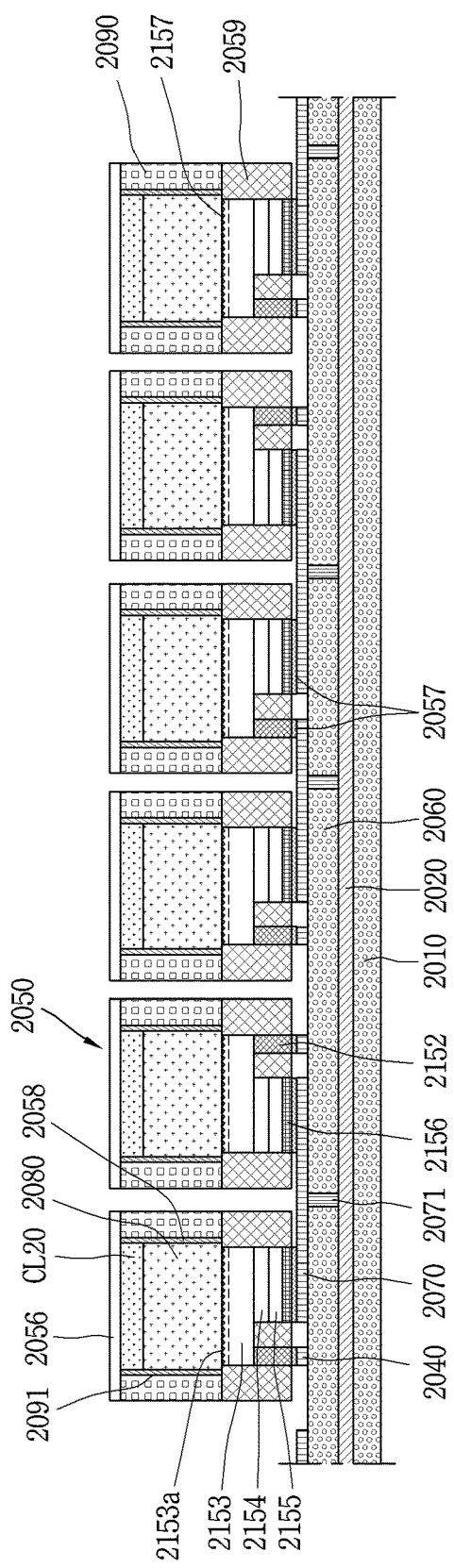
FIG. 16 is a cross-sectional view taken along line G-G in FIG. 10.
Figure 17:
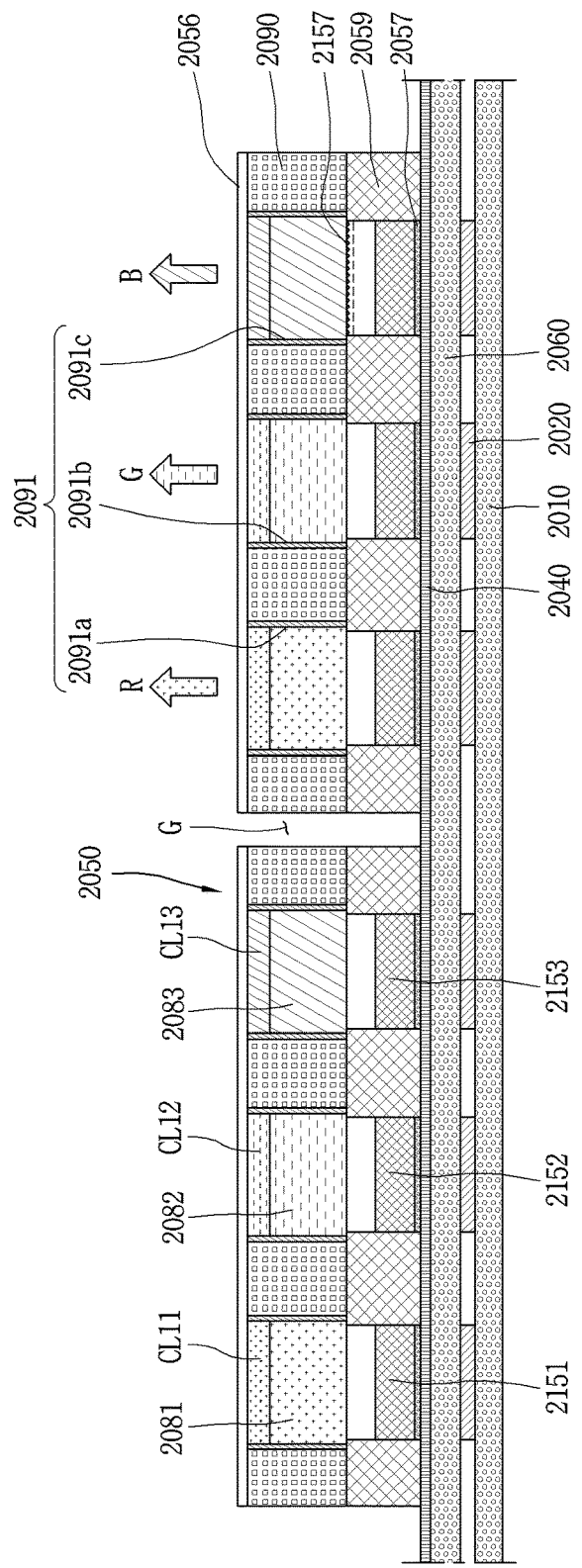
FIG. 17 is a cross-sectional view taken along line H-H in FIG. 10.

In particular, FIG. 15 is a partial perspective view illustrating another embodiment of the present disclosure, FIG. 16 is a cross-sectional view taken along line G-G in FIG. 10, and FIG. 17 is a cross-sectional view taken along line H-H in FIG. 10. According to the illustrations of FIGS. 15 through 17, a display device 2000 using a passive matrix (PM) type semiconductor light emitting device is illustrated as a display device 2000 using a semiconductor light emitting device. However, an example described below can be also applicable to an active matrix (AM) type semiconductor light emitting device.

The display device 2000 includes a substrate 2010 and a plurality of semiconductor light emitting device packages 2050. The substrate 2010 can be a wiring substrate on which a first electrode 2020, an auxiliary electrode 2070 and a second electrode 2040 are arranged, and has the same structure as that of the substrate described above with reference to FIGS. 10 through 12. Therefore, the description thereof will be substituted by the earlier description.

The plurality of semiconductor light emitting device packages 2050 are obtained by cutting unit substrates on a wafer, which include a plurality of semiconductor light emitting devices 2051, 2052, 2053, a growth substrate 2090, and a wavelength conversion material 2080. Each of the plurality of semiconductor light emitting devices 2051, 2052, 2053 can have the foregoing structure with reference to FIG. 4 and can be mostly formed of gallium nitride, and indium (In) and/or aluminum (Al) can be added thereto to implement a high-power light emitting device that emits blue light.

For example, the plurality of semiconductor light emitting devices 2050 can be gallium nitride thin layers formed with various layers, such as n-Gan, p-Gan, AlGaN, InGan, and the like. However, the present disclosure is not limited thereto, and the plurality of semiconductor light emitting devices can be implemented as light emitting devices that emit green light.

The plurality of semiconductor light emitting devices 2051, 2052, 2053 are three subpixels, which are combined to constitute one RGB pixel. For example, the semiconductor light emitting device includes a p-type electrode 2156, a p-type semiconductor layer 2155 on which the p-type electrode 2156 is formed, an active layer 2154 formed on the p-type semiconductor layer 2155, an n-type semiconductor layer 2153 formed on the active layer 2154, and an n-type electrode 2152 disposed on the n-type semiconductor layer 2153 to be spaced apart in a vertical direction to the p-type electrode 2156. In this instance, the n-type electrodes 2152 of the plurality of semiconductor light emitting devices 2051, 2052, 2053 can be extended in one direction and integrated with an n-type electrode of another semiconductor light emitting device.

According to the illustration, the protective layer 2059 is formed to fill between the semiconductor light emitting devices, and is formed on one surface of the growth substrate 2090 to form an upper protective layer. The structure of the protective layer 2059 can be the same as that of the foregoing protective layer with reference to FIGS. 10 through 12, and thus the description thereof will be substituted by the earlier description.

Meanwhile, a wiring substrate electrically connected to the electrodes of the semiconductor light emitting device is disposed on an opposite side of the growth substrate by interposing the semiconductor light emitting device therebetween. The growth substrate 2090 is a substrate on which the semiconductor light emitting device is grown to allow gallium nitride to grow.

For example, the growth substrate 2090 can be formed of a carrier wafer, a material suitable for semiconductor material growth. The growth substrate 2090 can be formed of a material having an excellent thermal conductivity including a conductive substrate or insulating substrate. For example, a SiC substrate having a higher thermal conductivity compared to a sapphire ($Al_2O_3$) substrate or at least one of Si, GaAs, GaP, InP and $Ga_2O_3$ can be used.

In this example, the growth substrate 2090 can be a silicon substrate having a silicon material. As described above, since the substrate is based not on a sapphire substrate but on a silicon substrate, and the substrate can be used as a partition wall structure. Specifically, in this example, the n-type semiconductor layer 2153 of the semiconductor light emitting device is disposed on one surface of the growth substrate 2090 to allow the semiconductor light emitting device to grow, and a protective layer can be coated on the one surface to fill between the individual devices. In addition, since the growth substrate 2090 is a cuttable silicon substrate, three semiconductor light emitting devices 2051, 2052, 2053 corresponding to red, green, and blue pixels are provided to form a unit substrate.

The foregoing three semiconductor light emitting devices 2051, 2052, 2053 are disposed on the unit substrate, and a through holes 2091 can be formed by etching. The through hole 2091 passes through the growth substrate 2090 at a position overlapping with the semiconductor light emitting device.

A plurality of through holes 2091 can be provided to correspond to the semiconductor light emitting devices, respectively. Meanwhile, the wavelength conversion material 2080 is filled into the through hole 2091 to convert a wavelength of light emitted from the semiconductor light emitting device. Furthermore, a reflective layer 2058 can be coated on an inner wall of the through hole.

Here, the through-hole 2091, the wavelength conversion material 2080, and the reflective layer 2058 can have the same structure as the through-hole, the wavelength conversion material, and the reflective layer described above with reference to FIGS. 10 through 12, and thus the description thereof will be substituted by the earlier description. Accordingly, a red phosphor 2081 can be filled into a first through hole 2091a, and a green phosphor 2082 can be filled into a second through hole 2091b. In this instance, a light transmitting material 2083 can be filled into a third through hole 2091c as a position forming a blue pixel.

Further, according to the illustration, the color filter (CL20) is disposed to cover the wavelength conversion material 2080. For example, a color filter (CL20) for filtering light emitted from the wavelength conversion material 2080 can be disposed within the through hole 2091 on the other surface of the growth substrate 2090. In this instance, the wavelength conversion material 2080 fills a part of the through hole 2091, and the color filter (CL20) fills the rest thereof. Therefore, a phosphor layer and a color filter layer can be layered within the through hole 2091. However, the present disclosure is not necessarily limited thereto, and the color filter (CL20) can be disposed on a surface of the growth substrate at a position overlapping with the through hole 2091 as illustrated in the foregoing example.

In this instance, the color filter (CL20) is formed to selectively transmit light to implement red, green and blue colors. In this instance, the phosphors 2081, 2082 or light transmitting material 2083 is combined with the color filter (CL20) to realize red, green, and blue sub-pixels. Here, the color filter (CL20) can include three filtering portions (CL21, CL22, CL23) for filtering a red wavelength, a green wavelength, and a blue wavelength to be a unit color filter corresponding to a unit substrate. The three filtering portions can be a red filtering portion CL21, a green filtering portion CL22, and a blue filtering portion CL23, respectively.

In addition, on the contrary to the foregoing example with reference to FIGS. 10 through 12, the growth substrate forms a partition wall between the color filters without a black matrix. A semiconductor light emitting device package having the foregoing structure can include a low melting point portion 2057 formed of a material having a lower melting point than the wiring electrodes 2020, 2070 of the wiring substrate. However, the present disclosure is not necessarily limited thereto, and the low melting point portion 2057 can be formed to surround each of the conductive electrodes of the wiring electrodes and the plurality of semiconductor light emitting devices.

For such an example, the low melting point portion 2057 can be plated with a solder material on the first electrode 2020 and the auxiliary electrode 2070. The solder material can be at least one of Sb, Pd, Ag, Au and Bi, for example. In this instance, solder can be deposited on the first electrode 2020 and the auxiliary electrode 2070 of the wiring substrate, and soldering can be performed using thermal energy. However, the present disclosure is not limited thereto, and it is also possible to couple a semiconductor light emitting device to a wiring electrode by the foregoing conductive adhesive layer.

According to the illustration, the wiring substrate 2010 can have a wider area than that of the unit substrate. A plurality of unit substrates can be arranged on the wiring substrate 2010 at preset intervals, thereby implementing a display device. A vacant space (G) can be formed between the unit substrates as illustrated in the drawings, but the present disclosure is not necessarily limited thereto. For example, the vacant space (G) can be filled with an insulating material or the like or the unit substrates can be disposed to be brought into contact with each other without having the vacant space. The lower protection layer 2056, the undoped semiconductor layer 2153a with grooves 2157, electrode hole 2071 and insulating layer 2060 are also shown.

According to the foregoing structure, a large-area display device can be implemented using a semiconductor light emitting device package distinguished as individual pixels on a wafer as illustrated in this example.

The configurations and methods according to the above-described embodiments will not be applicable in a limited way to the foregoing display device using a semiconductor light emitting device, and all or part of each embodiment can be selectively combined and configured to make various modifications thereto.

What is claimed is:

1. A display device, comprising:
   a growth substrate;
   a plurality of semiconductor light emitting devices grown on the growth substrate and disposed on one surface of the growth substrate;
   a plurality of through holes passing through the growth substrate at positions overlapping with the semiconductor light emitting devices;
   a wavelength conversion material filled into the through holes to convert a wavelength of light emitted from corresponding semiconductor light emitting devices;
   a wiring substrate electrically connected to an electrode of the semiconductor light emitting devices disposed at an opposite side of the growth substrate by interposing the semiconductor light emitting devices therebetween;
   a reflective layer formed on an inner wall of a corresponding through hole; and
   a protective layer filled between the semiconductor light emitting devices formed on the one surface of the growth substrate,
   wherein at least part of a corresponding through hole overlaps with the protective layer in a thickness direction of the growth substrate, and
   wherein reflective particles are mixed into the protective layer.

2. The display device of claim 1, wherein the semiconductor light emitting devices comprise gallium nitride, and the growth substrate is configured to grow the gallium nitride.

3. The display device of claim 1, wherein the growth substrate comprises a silicon material to enable etching for the through holes.

4. The display device of claim 1, wherein the wavelength conversion material comprises a phosphor surrounded by the reflective layer.

5. The display device of claim 1, wherein the reflective layer is formed to completely cover the inner wall of the corresponding through hole.

6. The display device of claim 1, further comprising:
   a plurality of color filters for filtering light emitted from the wavelength conversion material disposed on the other surface of the growth substrate to overlap with the through holes.

7. The display device of claim 6, further comprising:
   a black matrix covering the other surface of the growth substrate disposed between the color filters.

8. The display device of claim 1, wherein one surface of a corresponding semiconductor light emitting device closest to the through hole includes a textured surface.

9. The display device of claim 1, wherein the growth substrate comprises a plurality of unit substrates to which at least three semiconductor light emitting devices are attached, and
   wherein the unit substrates are arranged at preset intervals on the wiring substrate.

* * * * *